United States Patent
Kitchin et al.

(10) Patent No.: US 10,768,242 B1
(45) Date of Patent: Sep. 8, 2020

(54) GROUND-FAULT PROTECTION FOR DIRECT CURRENT CIRCUITS

(71) Applicant: Cottonwood Creek Technologies, Inc., Centennial, CO (US)

(72) Inventors: Dwight W. Kitchin, Parker, CO (US); Alan K. Schott, Centennial, CO (US)

(73) Assignee: COTTONWOOD CREEK TECHNOLOGIES, INC., Centennial, CO (US)

(*) Notice: Subject to any disclaimer, the term of this patent is extended or adjusted under 35 U.S.C. 154(b) by 46 days.

(21) Appl. No.: 15/993,145

(22) Filed: May 30, 2018

Related U.S. Application Data

(60) Provisional application No. 62/513,019, filed on May 31, 2017.

(51) Int. Cl.
| | |
|---|---|
| *G01R 31/50* | (2020.01) |
| *H02J 4/00* | (2006.01) |
| *G01R 27/08* | (2006.01) |
| *H04B 3/46* | (2015.01) |
| *H04M 19/00* | (2006.01) |
| *H04B 3/54* | (2006.01) |

(52) U.S. Cl.
CPC ............. *G01R 31/50* (2020.01); *G01R 27/08* (2013.01); *H02J 4/00* (2013.01); *H04B 3/46* (2013.01); *H04B 3/54* (2013.01); *H04M 19/001* (2013.01)

(58) Field of Classification Search
CPC ...... G01R 31/02; G01R 31/025; G01R 27/08; H04B 3/54; H04B 3/46; H04M 19/00; H04M 19/001; H02J 4/00
See application file for complete search history.

(56) References Cited

U.S. PATENT DOCUMENTS

| | | | |
|---|---|---|---|
| 3,768,011 A | 10/1973 | Swain | |
| 3,974,438 A * | 8/1976 | Alves, III | G01R 19/16571 330/2 |
| 8,594,314 B2 | 11/2013 | Kitchin et al. | |
| 9,596,362 B1 | 3/2017 | Smock et al. | |
| 2002/0118501 A1 * | 8/2002 | Ochi | H02H 9/004 361/93.9 |
| 2006/0049694 A1 * | 3/2006 | Kates | H02J 3/14 307/132 E |

* cited by examiner

*Primary Examiner* — Son T Le

(57) ABSTRACT

Systems and methods for detecting ground faults in a power transmission circuit powering a load. The system includes a common mode union that is connected to a positive terminal of a power supply and a negative terminal of the power supply. The power supply may be a bifurcated symmetrical power source. A power supply symmetry circuit is connected to the common mode union and a offset threshold comparator circuit is connected to the power supply symmetry circuit. The offset threshold comparator circuit is configured to compare a signal from the power supply symmetry circuit to a threshold voltage value and generate a ground-fault signal indicating a ground fault when the signal from the power supply symmetry circuit exceeds a threshold voltage value. A local load control circuit is connected to the offset threshold comparator circuit and configured to receive a signal from the offset threshold comparator circuit.

18 Claims, 12 Drawing Sheets

(Ground Fault Detection)

Overview

Fig. 2 Ground-fault Detection

Fig. 3 Over-Current Detection

Fig. 4 Over-Voltage Detection (Ground Fault Detection)

(Over Current Detection)

(Over Voltage Detection)

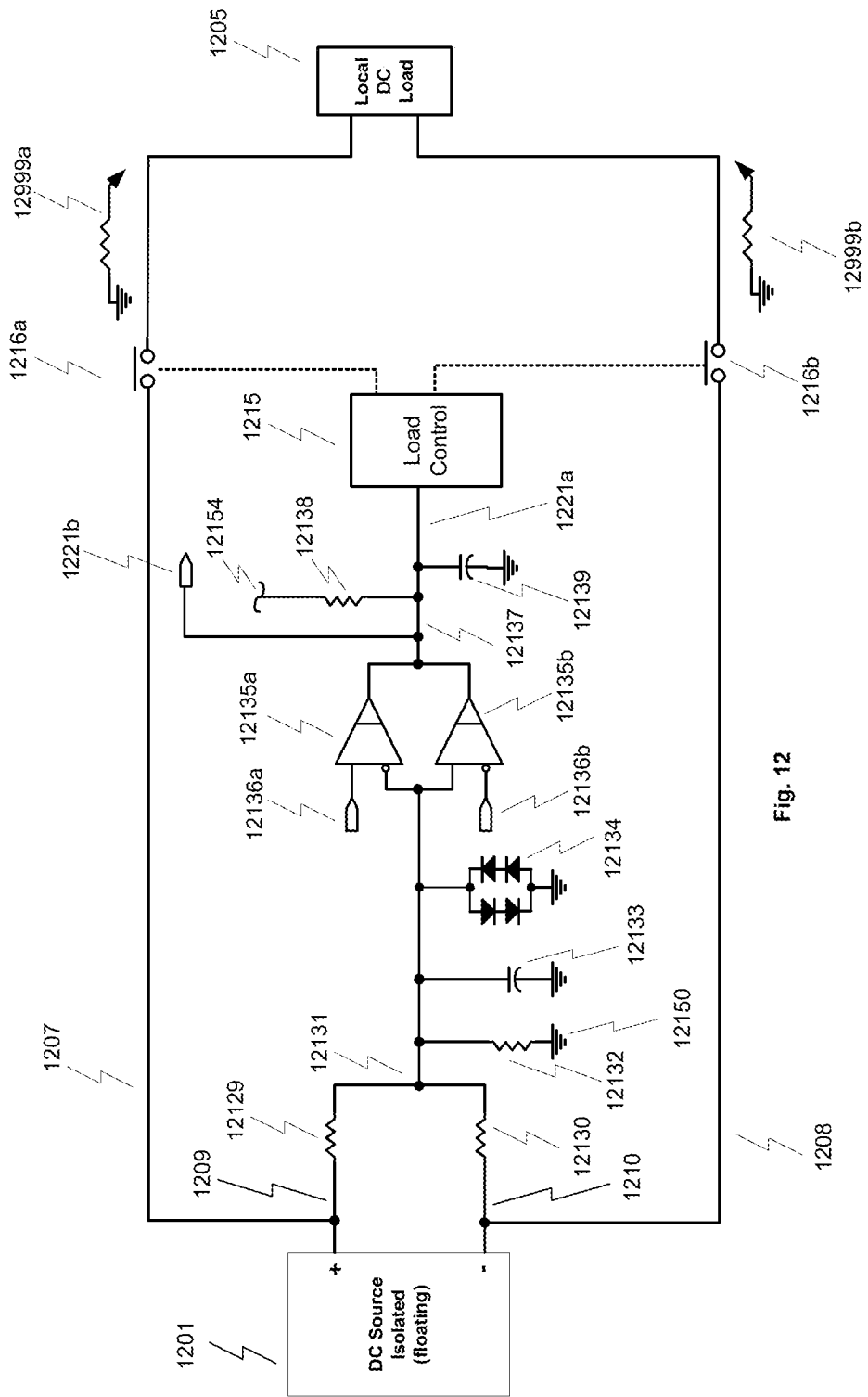

GROUND-FAULT PROTECTION FOR DIRECT CURRENT CIRCUITS

RELATED APPLICATION

This application claims the benefit of U.S. Provisional Patent Application No. 62/513,019, filed on May 31, 2017, and titled "GROUND-FAULT PROTECTION FOR DIRECT CURRENT CIRCUITS," the entirety of which is incorporated herein by reference.

INTRODUCTION

Due to the relative ease of generating, distributing and using alternating current in commercial applications, "AC" current has traditionally been the preferred source of electrical power in commercial and residential applications of fixed location in the United States. A major exception to this has been the use of direct current ("DC") for powering land lines through the "plain old telephone system" ("POTS") as it is known in North America.

Regardless of whether AC or DC current is employed, there is always concern to protect against undesirable conditions sometimes called "faults" that might damage electrical components and circuitry or might result in physical "shocks" or other physiological effects to individuals. One of those events is a condition known as a "ground-fault," i.e. an unintended leakage of current from the circuit to the ground caused, for example, by partial or complete disconnection of wiring, a short circuit, or contact with an unshielded individual. Other undesirable conditions include "over-voltage" or "over-current" situations where the voltage or current in a circuit exceeds desired levels.

To mitigate potential adverse effects from these undesirable conditions, standards have generally been employed to govern such things as the maximum voltage and maximum current employed in common AC and DC delivery systems. For example, alternating current is generally employed at 110/220 VAC and 20 A in North America. Direct current employed in telephony has generally been limited to 70 VDC and about 40 mA in North America. Delivery systems are usually designed to be within these limits.

Nevertheless, it is important that AC and DC electrical systems also be designed to detect and avert the consequences of undesired events. In the case of alternating current, for example, technology has been employed to mitigate or prevent equipment damage or physiological effects by employing ground-fault protection ("GFP") systems. A number of effective systems exist and are employed to provide protection in AC powered electrical circuits in both commercial and residential situations. For example, many home owners would recognize the ground fault current interrupter ("GFCI") as the somewhat "unusual" wall socket in the bathroom that shuts off electrical power quickly in the event of a problem.

For ground-fault protection systems commonly available from hardware stores or electrical contractors for AC systems, the standard defined by the international community is about 5 milliamps ("mA") of leakage current leakage. Such GFCI circuits are set to trip at or about that level. Other limits may be appropriate for detection of current leakage in other situations, such as high voltage industrial power transmission circuits where use of a low 5 mA limit for AC would be inappropriate. In the case of DC circuits the international standard for current leakage is 2 mA.

Typically, ground-fault detection systems in AC circuits employ simple, low cost, coils of wire configured to measure the small oscillating magnetic fields that accompany all AC current-carrying conductors. The coil is configured in such a manner to act as transformer with opposing, but normally equal strength, inputs from each of the conductors that provide the AC power within the protected circuit, i.e., "loop." As long as the currents in the current-carrying conductors are identical, the oscillating magnetic fields will exactly cancel each other, and the sensing coil provides no output signal, effectively indicating that there is no problem in the protected circuit/loop. But if a fault current path is established, the currents in the primary conductors will no longer be equal. The coils surrounding those conductors will have unbalanced magnetic fields that no longer cancel each other out. And a detectable, measurable AC voltage appears between the ends of the detection coil. In the case of a "home GFCI," a leakage current of more than 5 mA results in the tripping of an internal latching relay, much like a circuit breaker and the output side of the circuit/loop is disconnected.

There are problems, however, in trying to adapt AC ground-fault protection methodology, i.e., the detection of unbalanced currents using magnetic fields, to DC circuits. Among other things, monitoring magnetic fields is a difficult problem as varying magnetic fields do not exist for a steady load in a DC circuit. And changes in the magnetic field may well be entirely due to normal load changes and not due to an undesirable ground-fault situation. The alternative of attempting to use multiple current measuring devices to monitor current changes in DC circuits presents problems in the location of such devices, analysis of the currents they detect, and computational processing with associated expense, inaccuracies, and delay in disconnecting the circuit in the event of an actual ground fault. If one also accounts for the range of possible, anticipated conductor currents, particularly one requiring enough sensitivity to permit detection of a current difference in the order of a few milliamps, the task of creating a workable DC leakage current detection system with a current comparison model becomes quite daunting.

Some protection systems are known for DC systems. But these involve large industrial DC powered circuits, such as those for transmitting DC power long distances from hydroelectric plants in northern Canada to distant metropolitan centers of use. (See, e.g., U.S. Pat. No. 3,768,011, et al. issued to Swain on Jun. 9, 1978.) Typically these systems are concerned with very high voltage (e.g., 1.5 million volts) and very high power and are designed to address situations, for example, where such a power line has come down due to severe weather and is contacting the ground in a remote area. For economic and other reasons, the utility company needs to know that there is a ground-fault in the system, despite the system's continuing to transmit significant power. Even the most practical of these methods is complicated, expensive, and not necessarily designed to take immediate corrective action. In addition, there are a number of problems involved in attempting to reliably scale this methodology to lower power circuits, for example, a POTS telephony circuit with a maximum 2 mA current leakage target. From a calibration point of view, it may be problematic to avoid nuisance tripping.

Thus, in low current DC applications, safety has traditionally been provided by controlling the power source below the level defined by national and international standards. In addition, means can be provided to ensure low levels of leakage current by intentionally including series impedances large enough to guaranty that the maximum possible current, even in the event of a direct short circuit, will be less than those standards. However, such techniques effectively preclude supplying significant power over the circuits thus protected.

SUMMARY

Embodiments of the technology relate to power transmission circuits including a direct current power source comprising at least one positive terminal or output and at least one negative terminal or output with the terminals being connected so as to transmit power to an electrical load. More specifically, the technology relates to systems and methods for detecting and acting upon a ground-fault event in the power transmission circuit comprising: a common mode union attached in a separate circuit to a positive and a negative terminal of the power source; a circuit attached to the common mode union for detecting symmetry in the power transmission circuit and providing information regarding that symmetry; a circuit comprising an offset threshold comparator for comparing the symmetry information to a pre-set threshold value and for producing an output indicating a ground-fault event when the threshold is exceeded; and a relay to open the transmission circuit when it receives the output indicating a ground-fault event.

In addition to methods and systems for ground-fault protection ("GFP") detection, methods and systems may be provided for "over-voltage" and/or "over-current" detection. In addition, embodiments of the systems and methods may include an intentional low open circuit voltage regardless of the normal operating voltage. These systems may be separate and act independently. They may also be inter-related both in the equipment and methods employed to make the necessary detections and in the equipment and method employed to take any alarms or error signals and to take action upon them, e.g., to promptly remove or isolate the problem in the circuit.

As used herein, a "common mode union" comprises a separate connection directly between two terminals of a DC power source (e.g., the more negative terminal of a positive power source and the more positive terminal of a negative power source) with the connection containing at least one resistor or other impedance that provides an "access point" for the ground-fault detection and/or over-current detection systems to obtain information, such as voltage or current, indicating the status of current conditions on the main power transmission circuit or other portions of the circuit via the power source. In one sense, the common mode union is a connection between positive and negative portions of the power supply. It also defines a pair of physical locations between which measurements can be taken or observed regarding the current and the balance of the circuit, which leads to the ground-fault detection. The common mode union is used for measurement or observation—not for output to one or more loads that need power. It is the physical point between which the ground-fault detection system and/or the over-current detection system can measure and monitor conditions in the main power transmission circuit. It is a pair of connection points between which a potential is created (e.g. by the connecting resistor(s), restrictive component or other element) that then can be detected and measured for determinations to be made by those systems.

The ground-fault detection system may be employed with many DC circuits and power sources including, for example, a bifurcated symmetrical power source or a "floating," i.e., isolated DC power source. In one application it is employed in a circuit for delivering enhanced power in excess of that traditionally used by a standard POTS telephone architecture.

As more fully described herein, an advantage of the ground fault protection system is that it is an analog based system relying on hardwired circuitry that acts immediately to detect a ground-fault in excess of a pre-defined maximum and to disengage the circuit in the event of such a fault. No computational capability is required in accomplishing that result.

BRIEF DESCRIPTION OF THE DRAWINGS

Non-limiting and non-exhaustive embodiments of the technology are illustrated with reference to the following drawings.

FIG. 12 is a diagram illustrating another embodiment of a ground-fault protection system, i.e., as implemented on a floating, i.e., isolated, DC power supply.

DETAILED DESCRIPTION

Figure 1:
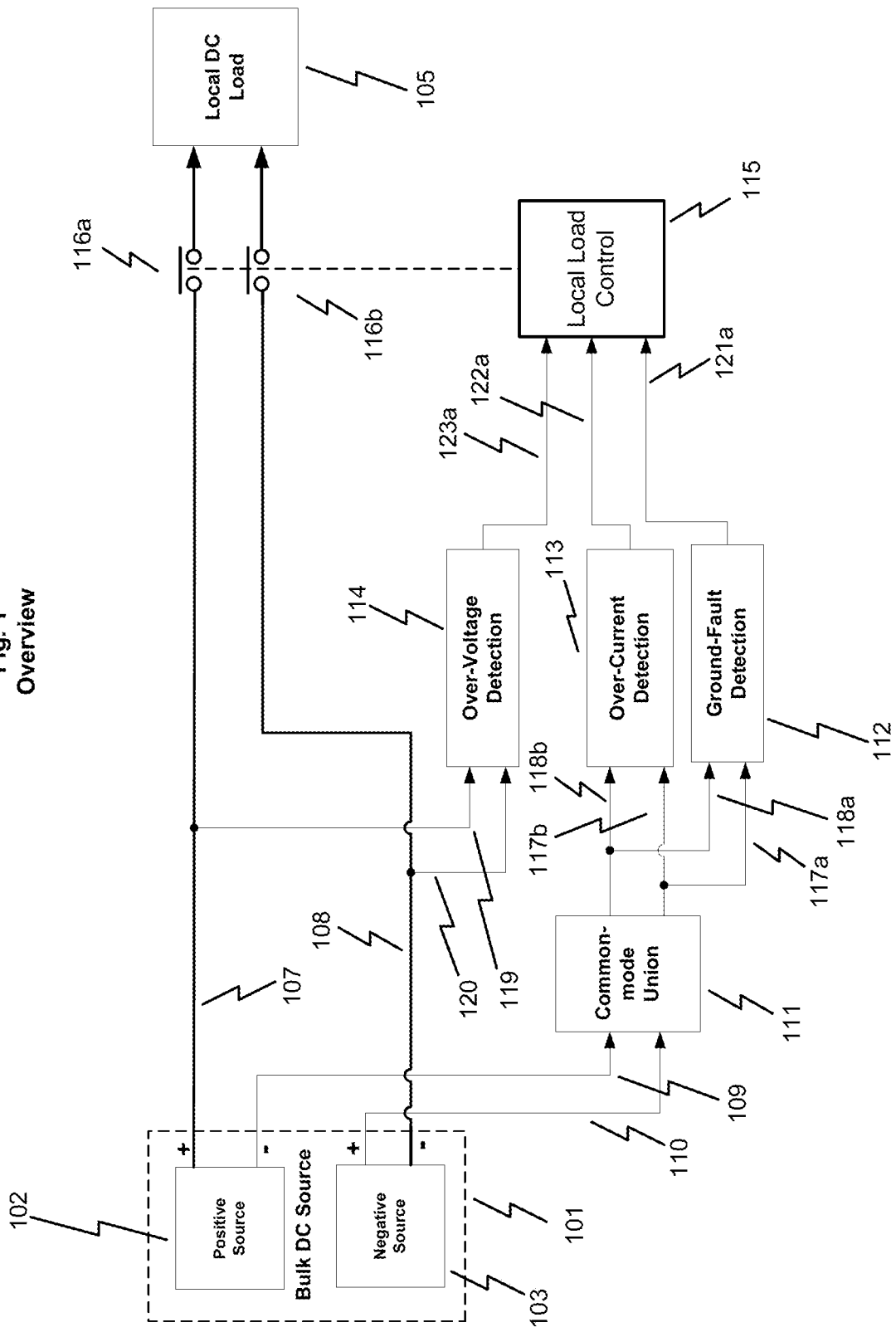
FIG. 1 is a diagram of a DC powered circuit depicting an overview of one embodiment of system architecture including various subsystems for ground-fault, over-voltage and over-current protection.

Aspects of the present technology may be further understood with reference to the following description of sample embodiments such as those depicted in the accompanying drawings. Note that, in general, it is the intention that like items in multiple figures have like reference numbers.

As mentioned above, FIG. 1 illustrates one embodiment of system architecture including embodiments of various subsystems for ground-fault, over-voltage and over-current protection systems of the present technology. The basic purpose of the circuit shown in the schematic is for a bulk DC power source 101 to provide electrical power for purposes of operating local DC load 105. In that regard, it should be noted that embodiments of the technology are particularly useful for DC circuits involving less voltage than that associated with large industrial DC powered circuits, such as the long-distance transmission of DC power. For example, the technology may be deployed in telephony applications including circuits that involve voltages and current (e.g., 300 volts and at least several amps) in excess of that normally supplied by a POTS network.

In general, embodiments of the present technology may be employed or adapted to be employed with a wide range of DC power sources. In general, the output terminals may not be connected to ground but are allowed to "float." One of the more effective, i.e., most efficient sources of power delivery compatible with ground fault detection employs two related power sources—one positive and one negative—of generally equal or symmetrical voltages. The use of a switch-mode power supply ("SMPS") is a relatively convenient and easy way to obtain those advantages including equal voltages at the terminals. But embodiments of the technology may also be employed with somewhat unbalanced voltages where the maximum power delivery capability for ground fault detection will diminish but may still be usable for a specific purpose. For example, one could use embodiments of the technology retrofit a current DC circuit by "opening" an output terminal of an existing power source in such a way to remove an existing reference to ground and by adding a separate common mode union and power bias device to add ground fault protection to the application in which the power source is involved.

For purposes of this description, aspects of the technology are illustrated in connection with a DC power source 101 which includes two balanced, symmetrical power sources—positive source 102 and negative source 103. A stabilized symmetrical power supply unit is an embedded circuit, or stand-alone unit, the function of which is to supply two complementary stable voltages to a circuit or device that must be operated within certain power supply limits. A "stabilized" power supply unit ensures that the output remains within certain limits under various load conditions, or it may also include compensation for variations in its own supply source.

As used herein, "balanced" refers to the quality of multiple power sources having the same voltage or essentially the same electrical potential for each of the separate—and otherwise isolated—power supplies. While the power sources do not individually have the same terminal voltages (i.e., voltage relative to an earth reference), they are "symmetrical" in the sense that they exhibit terminal voltages (i.e., voltage potential at each individual electrical connection point) that are "mirror images" of terminal voltages of the other power sources as compared to the most common zero volt potential, earth. Although two separate sources are illustrated in FIG. 1, the technology could be used with any number of separate, balanced and symmetrical power supplies.

For purposes of the present technology, it is important to note that the two sources are intended to normally have the same absolute voltage. However, one of the sources 102 is more positive and the other source 103 is more negative, as they are depicted in FIG. 1.

Local load 105 may be anything that is powered by and in that sense "consumes" DC power. This may include, for example, a standard telephone or many other types of communication devices. An example for one useful application of the present technology is to employ it in systems such as that described in U.S. Pat. No. 8,594,314 ("the '314 Patent") which has the same inventors and assignee as the present application and is incorporated by reference in its entirety herein. The '314 Patent identifies systems and methods to provide additional DC power to a local load. This improved power can be delivered even if a traditional telephone instrument is not actually employed at that location or if the telephone is not employed for the traditional purpose of voice "telephone" communications. In other words, the increased power can be used to enable some communications device or one or more other instruments or capabilities employed with, or in lieu of, the local telephone. Examples of communications devices include telephones, speaker phones, non-telephone, yet telephone-like instruments, such as a video phone or non-telephone-like devices that may optionally include telephone communications features such as a computer or microcontroller based display and user interface device primarily intended to access data or user related services. Some of these communications devices would traditionally be AC line powered devices, but can be operated with enhanced DC power as described in the '314 Patent.

As shown in FIG. 1, the current-carrying line from the more positive terminal of positive power source 102 is designated as line 107, and the line from the more negative terminal of negative source 103 is designated as line 108. These lines connect power source 101 with the local load 105. As such, they may be referred to herein as the "power transmission lines." This circuit of which they are a part is the "power transmission" circuit or loop or, sometimes, the "main" circuit or loop.

In addition, FIG. 1 shows a line from the more negative terminal of positive source 102, designated as line 109, and a line from the more positive terminal of negative source 103, designated as 110. Of significance, these "internal" negative and positive leads 109 and 110 go to a common mode union 111 described in more detail below. In one sense, the common mode union 111 is a direct connection between the independent power supplies. More importantly, it also defines a point where key observations or measurements can be derived for use by the ground-fault and over-current protection systems as described further below. This is so, because the signals on lines 109 and 110 indirectly, via the power source 101, reflect conditions in the power transmission lines 107 and 108. In the embodiments depicted herein, the common mode union 111 is not configured to supply power to one or more loads that need power. Instead, the common mode union 111 provides an access point or location for monitoring the main circuit and providing inputs to the ground-fault protection system 112 and the over-current protection system 113 as described later. It is a physical point where the potentials are created that can then be utilized by those systems to monitor and make their determinations regarding conditions in the power transmission circuit.

Ground-fault detection system 112 observes or detects the "balance" in the system at the common-mode union 111 via connection 117*a* and 118*a*. Ignoring polarity/direction, "balance" generally refers to equal current in each output conductor 107 and 108 and equal voltages at signals 109 and 110 as a result (e.g., reflection) of the desired equal currents in the output conductor. The over-current detection system 113 measures current from the common-mode union point 111 via connection 117*b* and 118*b*. The signals on lines 117*a* and 117*b* are the same; the signals on lines 118*a* and 118*b* are also the same. In essence, the ground-fault detection system 112 and the over-current detection system 113 monitor events on the power transmission loop reflected by the output of the power supply 101.

In contrast, the over-voltage detection system 114 monitors events directly from the transmission lines 107 and 108 that provide power to local DC load 105. This is done via connections 119 and 120, respectively. Over-voltage detection system 114 can operate without reference to the common-mode union and does not require the common-mode union to take measurements or observations relevant to over-voltage conditions. Over-voltage detection system 114 measures only the total potential between the lines 107 and 108, regardless of their polarity relative to anything else.

As depicted in FIG. 1, each of the event detection systems has an event detection output to the local load control 115. The output of ground-fault detection system 112 is 121a; the output of over-current detection system 113 is 122a; and the output of over-voltage detection system 114 is 123a. Each of these is an input to the local load control 115. So each one of the detectors has a control signal that comes out of it and goes to the local load control. Basically, the local load control 115 acts as a switch controller. So when any of the detectors 112, 113, or 114 finds a fault condition, it immediately and automatically shuts off the power to the load 105 by interrupting the power transmission lines 107 and 108 at associated relay gates 116a and 116b, respectively.

Figure 2:
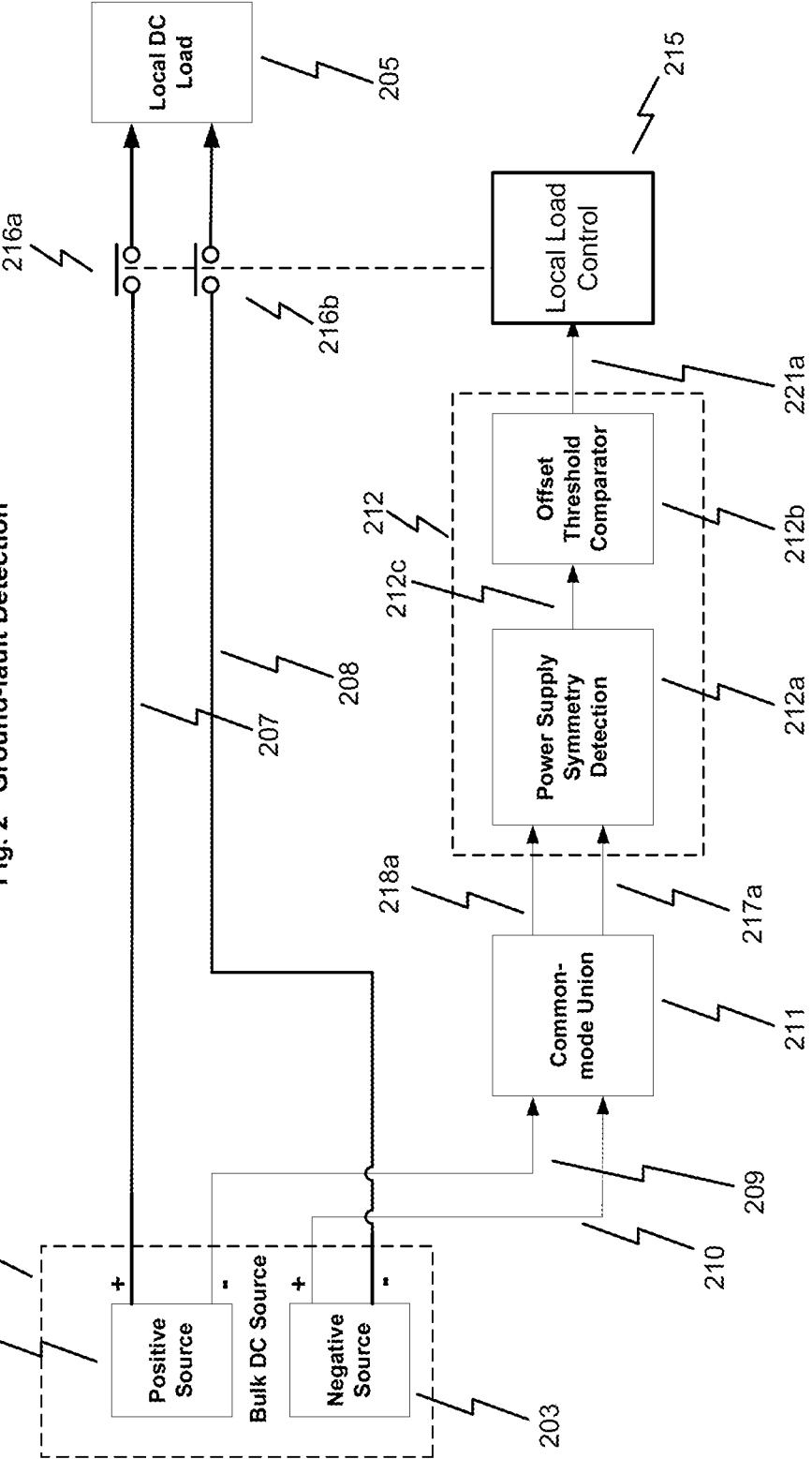
FIG. 2 is a functional block diagram showing the same DC powered circuit as in FIG. 1, but focusing on one embodiment of architecture for ground-fault protection.

FIG. 2 is a functional block diagram showing the same DC powered circuit as in FIG. 1, but focusing on one embodiment of architecture for ground-fault protection. As mentioned previously, existing ground-fault detection circuits for AC current or large scale DC systems are not workable in smaller DC circuit environments such as that used in telephony.

The embodiment of the ground-fault detection system identified as 212 on FIG. 2 comprises the functions of power supply symmetry detection 212a and an offset threshold comparator 212b. These, of course, operate from information regarding the power transmission circuit as provided via a common mode union 211. An example of the components and circuitry for one embodiment of a common mode union and a ground-fault detection system are depicted in and described in connection with FIG. 6.

As its name suggests, the function of the power supply symmetry detection system 221a is to determine preliminarily whether there is a variance or imbalance in the magnitude of the power supply signals 209 and 210 relative to ground at the common mode union 211. As explained in more detail later in connection with FIG. 6, the power supply symmetry detection is the preliminary measurement or evaluation function. It looks at the signals coming through the common mode union 211, which originally were 209 and 210, to see if they are very near the level of "ground," i.e., zero volts. It is a voltage-based analysis. Signals 209 and 210 should be very near zero because they are in the "center" of the two power supplies 202 and 203 and should normally be symmetrical around earth. Usually, one of the signals is slightly above and the other is slightly below ground potential. The absolute value of the positive and negative signals should normally be within a few millivolts of each other, but symmetrical about ground.

The symmetry of the voltages in the signals at the common mode union 211 reflects the status of conditions vis-à-vis signals 207 and 208 as they deliver power to the local DC load 205. Note that the values of 209 and 210 will always be half way between the values of 207 and 208 reflecting the symmetry in the power supply. For example, if there is a 100 volt difference between 207 and 208, then there will be approximately a 50 volt difference from 207 to 209 and a 50 volt difference between 208 and 210. But the difference between 209 and 210 may be, for example, 10 millivolts ("mV") as a result of the amount of current that is going through the common mode union into the power supply symmetry detection 220.

The ground-fault detection system 212 is concerned with the symmetry of the signals 209 and 210, not with the absolute value of either signal. Suffice it to say that the power supply symmetry detection 212a sends a signal 212c reflective of the symmetry or asymmetry of signals 209 and 210 (and hence 207 and 208) to offset threshold comparator 212b to determine whether there is an asymmetry of a magnitude reflective of a ground-fault condition.

The comparator 212b compares the signal 212c from 212a against a bench mark that is set to distinguish between a temporary perturbation in the signals and one that is likely to reflect a ground-fault condition. For example signals at the common mode union 211 may become slightly unsymmetrical due to conditions such as humidity in the air or other momentary or minor conditions such as a temporary minor difference in the lengths of wires in the circuit. Such "slight" differences (ordinarily in the range of nano-volts or pico-volts) should be ignored by the ground-fault detection system 212. In contrast, a relatively large amount of asymmetry in signals 209 and 210 at the common mode union 211 indicates that there is some other path that is disturbing the symmetry of the leads 207 and 208 and may reflect a ground-fault condition in the DC circuit. In a telephony application a benchmark used by comparator 221 may be set in the range of about 10 mV to about 10V and may be from about 500 mV to about 1.2V. The actual benchmark for a particular application would be chosen considering, among other things, the desired maximum asymmetry to be permitted and the scaling factors utilized by the detection system.

When the asymmetry meets or exceeds a certain pre-set threshold value, the offset detection comparator 212b sends a signal 221a to the local load control 215 that immediately opens associated gates 216a and 216b thereby interrupting the circuit and the power to the local DC load. As described later, a companion signal is also sent by the offset comparator 221 to the main power supply controller indicating that a fault has been detected. The load control 215 and the controller cooperate to manage the power transmission system in response to the fault as described, for example, in connection with FIGS. 5, 6, and 9-11.

Figure 3:
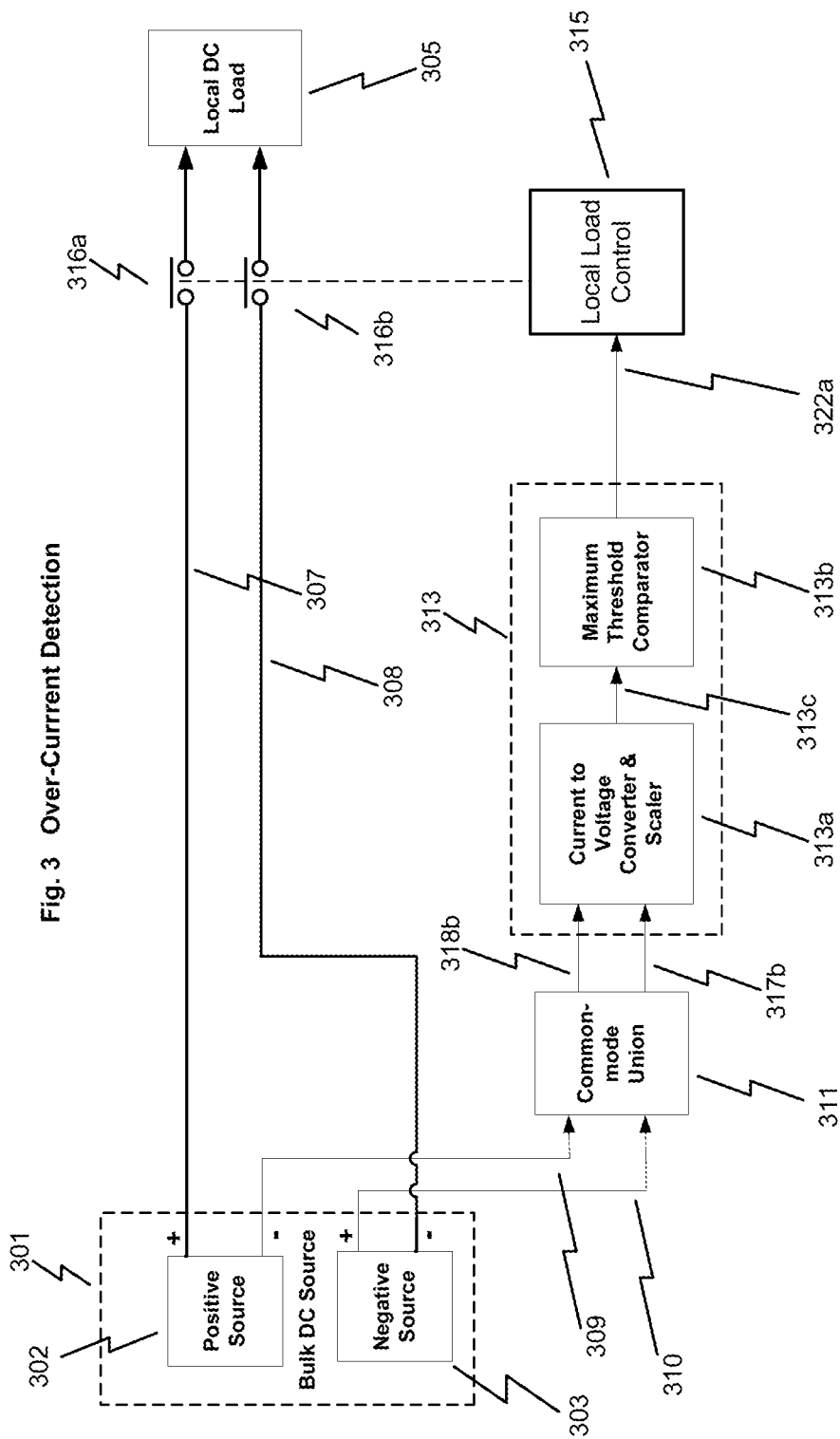
FIG. 3 is a functional block diagram showing the same DC powered circuit as in FIG. 1, but focusing on one embodiment of architecture for over-current protection.

FIG. 3 is a functional block diagram showing the same DC power circuit as in FIG. 1, but focusing on one embodiment of architecture for over-current protection. The over-current detection system 313 comprises the functions of current to voltage converter and scaler 313a and maximum threshold comparator 313b. These, of course, operate from information regarding the power transmission circuit as provided via common mode union 311. An example of the components and circuitry for one embodiment of a common mode union 311 and an over-current detection system are depicted in and described in connection with FIG. 7.

The over-current detection system monitors the main circuit for delivery of power via lines 307 and 308 to the local DC load 305. The over-current detection system monitors the current in that circuit through the representative voltage at common mode union 311. As the amount of current changes in the loop from the DC power source 301 to the local load 305 through signals 307 and 308, there is a corresponding proportional change in the voltage difference between the signals 309 and 310.

Scaling occurs at function 313a. By monitoring that voltage, block 313a then knows the corresponding load current. Thus, the system does not directly measure current, except in the fact that 313a performs the function of current to voltage conversion. Block 313b then takes the value of that voltage via input 313c, which represents the load current, and compares that representative voltage to a threshold value which is set at a previously set reference level indicating that too much current is flowing in the power transmission circuit. If the threshold is exceeded, then the over-current detection system sends signal 322a to the local load control 315 which will cause the power to be disconnected from the load by opening contacts 316a and 316b. As described later, over-current detection system also sends a companion signal to the main power supply controller indicating that a fault has been detected. The load control 315 and the controller cooperate to manage the power transmission system in response to the fault as described, for example, in connection with FIGS. 5, 7 and 9-11.

Figure 4:
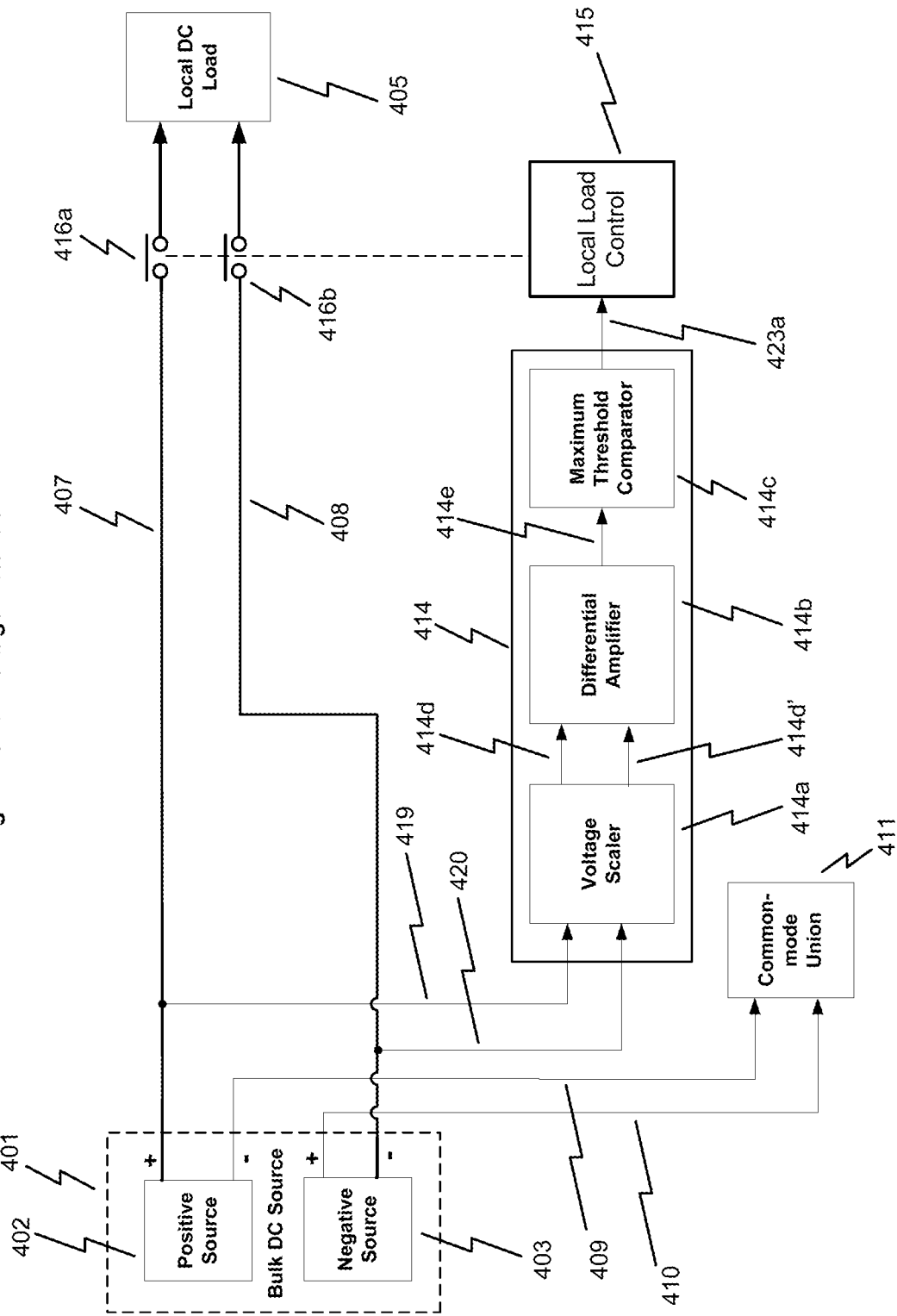
FIG. 4 is a functional block diagram showing the same DC powered circuit as in FIG. 1, but focusing on one embodiment of architecture for over-voltage protection.

FIG. 4 is a functional block diagram showing the same DC powered circuit as in FIG. 1, but focusing on one embodiment of architecture for over-voltage protection.

FIG. 4 depicts further details of one embodiment of the over-voltage detection system 114 in FIG. 1. As shown in FIG. 4, an embodiment of the over-voltage detection system 414 comprises the functions of a voltage scaler 414a, a differential (or instrumentation) amplifier 414b, and a maximum threshold comparator 414c. As mentioned previously, in one embodiment the over-voltage detection system accesses transmission lines 407 and 408 directly; it is not connected to nor does it use information from the common mode union 411. FIG. 4 includes the common mode union 411 only for the purpose of emphasizing that—unlike the ground-fault detection circuit 212 and the over-current detector 313—the over voltage detector 414 does not use information from the common mode union for its operation. This difference in source information is also indicated in the architecture overview depicted in FIG. 1 and by comparison the system architectures shown in FIGS. 2 (ground-fault) and 3 (over-current). In general, as used herein, the term "connected" may be indicative of a direct connection or an indirect connection, such an electrical connection between two components with other intervening components.

An example of the components and circuitry for one embodiment of an over-voltage detection system are depicted in and described in connection with FIG. 8.

At a high level, the over-voltage detector 414 is "looking" for a disparity in voltage across transmission lines 407 and 408 as compared to an expected level indicating an undesirable over-voltage situation. The detection system continuously monitors lines 407 and 408 via lines 419 and 420, respectively.

A voltage scaler 414a is particularly useful in situations (such as the example illustrated and discussed in connection with FIG. 5) in which the magnitude of the voltage between lines 407 and 408 may be as much as several hundred volts. To evaluate the voltage difference it is desirable first to "scale," i.e., proportionally reduce, the magnitude of the voltage of each of the signals carried by lines 407 and 408. Although the actual voltages on 407 and 408 could be utilized, equipment necessary to handle those larger voltages is expensive and the processes employed could suffer from a number of defects. By scaling these voltages down (e.g. to less than 5 or 10 volts), relatively standard electronic parts can be employed for further processing at considerably less expense. It is important that in scaling down each of signals 407 and 408 that this is performed precisely the same so that the difference in the scaled down voltages at 414d and 414d' accurately represents the difference in voltage between 407 and 408.

Because the positive power source 402 and the negative source 403 supplying the voltage on lines 407 and 408 are symmetrical, a traditional voltage scaler cannot be employed. With a simple voltage scaler a ground reference would be employed with a tap from the line being scaled and an adjustment made to select the desired scale with respect to ground. This may be difficult to implement so that identical scaling occurs on each of the transmission lines. And a single divider would unbalance and operate like a ground fault—which it would be.

Figure 8:
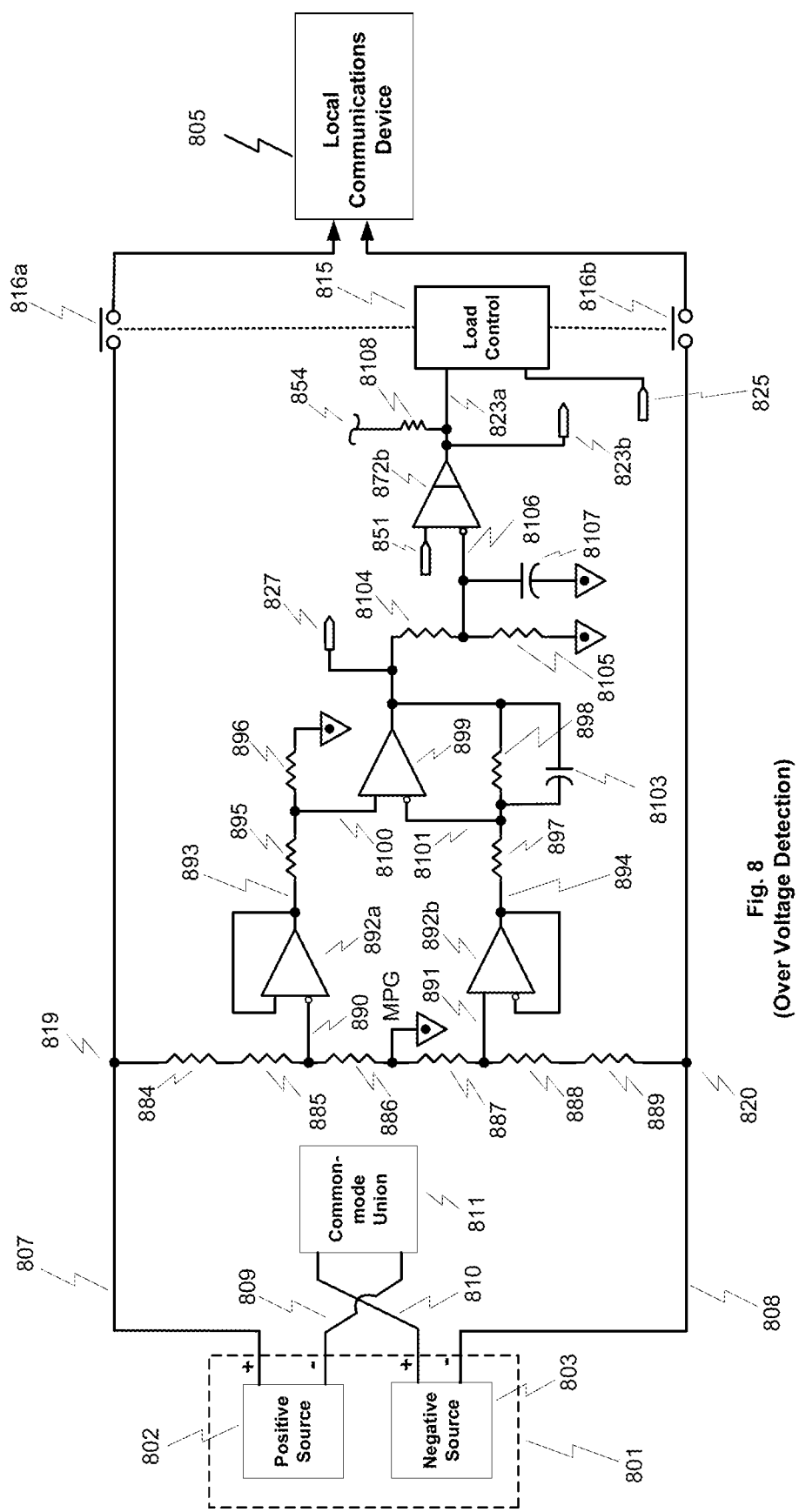
FIG. 8 is a circuit diagram illustrating in more detail one embodiment of an over-voltage protection system shown more generally in FIG. 5.

In one embodiment of the present technology, the voltage scaler 414a comprises a set of resistors such as shown in FIG. 8. As discussed previously, under normal operating conditions the power source 401 has one output that is more positive than ground and another that is more negative than ground. But with a balanced symmetrical voltage supply 401 that requires great precision to function properly. So two tap points are intentionally required. The resistors employed are very high precision resistors so that they are very precise for the same percentage scaling on both positive and negative signals 419 and 420.

So the voltage scaler is a balanced symmetrical precision matching of the input signals 419 and 420 from lines 407 and 408 in precisely scaled relationship. In the embodiment of FIG. 4, these scaled signals comprise the input 414d and 414d' into the differential instrumentation amplifier 414b. "Differential" in this case means that it is measuring the potential difference between those representative divided signals. But "instrumentation" here means that if they are unbalanced relative to earth, it still measures the difference correctly. In other words it measures the difference in the absolute value of the two signals. (For example, if the scaled value of one of the signals is +1.0 volt and the other one is −1.1 volts, the difference observed by the differential instrumentation amplifier 414b is 2.1 volts.)

The differential instrumentation amplifier 414b sends an output signal 414e to maximum threshold comparator 414c. Signal 414e conveys the difference between scaled signals, thereby providing an accurately scaled representation of the voltage difference between 407 and 408. Comparator 414c "looks" to see whether signal 414e meets or exceeds a threshold that is set as a scaled value of the maximum voltage difference that is desirable for signals on lines 407 and 408.

If signal 414e exceeds the maximum voltage threshold, the comparator sends a signal 423a to the local load control 415. As discussed previously, the local load control 415 interrupts the main circuit at 416a and 416b and the transmission of power to the local DC load 405. As described later, comparator 414c also sends a companion signal to the main power supply controller indicating that a fault has been detected. The load control 415 and the controller cooperate to the power transmission system as described, for example, in connection with FIGS. 5 and 8-11.

Example 1

Figure 5:
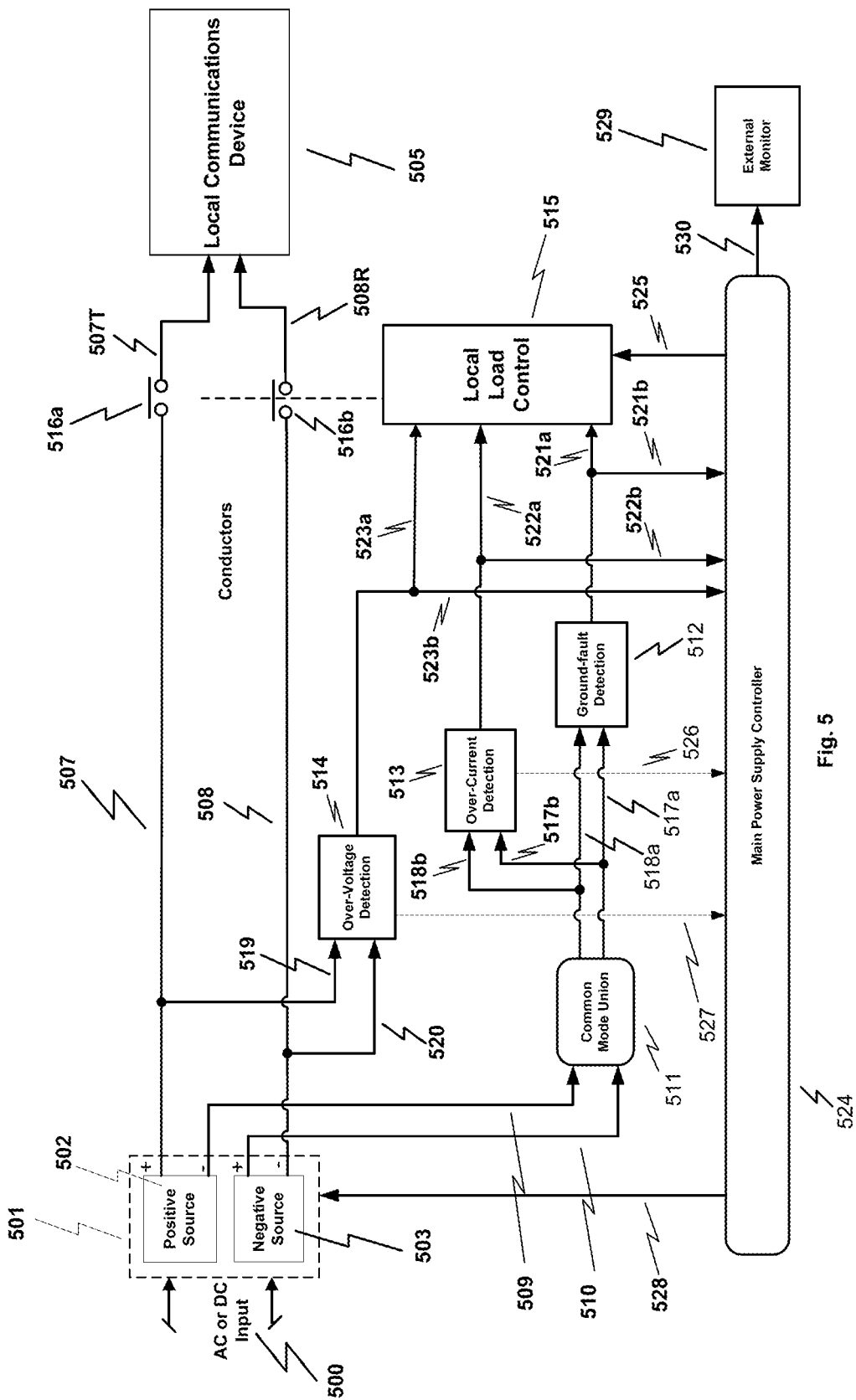
FIG. 5 is a block diagram illustrating an overview of exemplary architecture for embodiments of the ground-fault, over-current and over-voltage protection systems in a telephony circuit.

FIG. 5 is a block diagram illustrating an overview of exemplary architecture for embodiments of the ground-fault, over-current and over-voltage protection systems in a telephony system.

In one embodiment, the system depicted in FIG. 5 can be used to supply power over an existing POTS telephone system using legacy conductors, e.g., comprising a twisted wire pair, to operate a local load requiring power in excess of that used by a traditional telephone instrument. Such technology is described, for example, in the '314 Patent identified previously. In this example, the local communications device 505 is a wall mounted unit for use by inmates in a penal institution and comprises, for example, a telephone handset for audio communications, a touchscreen, intranet and/or internet access with associated browser, and a camera for viewing the area in front of the screen, e.g., the user. In one embodiment the output of the remote adjustable output power supply 501 is up to +/−70 volts and up to 400 milliamps ("mA") of DC current. The local communications device 505 requires about 60 volts and 250 milliamps of current for normal operation. The ground-fault, over-current and over-voltage detection systems of the present technology are particularly useful in such a system where voltage and current are employed above that routinely implemented in a telephony circuit, i.e., about 48 volts and 25 milliamps.

In this example remote DC power supply 501 receives DC input 500 from a bulk power source not depicted, but readily understood by one of ordinary skill in the art. The DC power source 501 includes a more positive source 502 and a more negative source 503 configured as described and shown in FIG. 1. By design and operation of the system, the absolute value of the two sources is intentionally the same for most beneficial operation, so that the power output of the positive and negative terminals of each one of them will both be adjusted at the same time to have the same value. The bipolar, "symmetrical" power supply in the example is a switch-mode power supply ("SMPS") having a maximum voltage output of +/−70 Volts.

Power supply 501 is an adjustable voltage output power supply. In response to instructions from the main power supply controller 524, the adjustable output voltage power supply 501 can operate to supply power anywhere between zero and the maximum voltage output of that power supply. This power may then be supplied through conductor 507 from the more positive side of the positive power source and conductor 508 from the more negative side of the negative power source to the local load 505 described previously. This is the power transmission loop or "main" loop.

Conductors 507 and 508 contain relay gates or contacts 516a and 516b, respectively, which are used by the load control 515 to cut off power to the local communications device when the load control receives an indication of a fault from any of the ground-fault detection system 512 via signal 521a, the over-current detection system 513 via signal 522a, or the over-voltage detection system 514 via signal 523a. The load control 515 then opens a relay that opens gates 516a and 516b immediately cutting off the transmission of power from the power supply 501 to the local communications device 505. The response speed of the gates is important for protection. For that reason, solid state relays having a response time generally of about <3 milliseconds or mechanical relays having a response time generally of about <5 milliseconds are preferred for some examples. The load control may also receive and act on a separate signal 525 from the main power supply controller 515 to disconnect the power supply 501 from the local communications device 505. This can be done for ordinary operations or otherwise. When the relay gates are closed, DC power passes through lines 507 and 508 to 507T and 508R where they constitute the "tip" and "ring" signals to the local communications device 505.

The more negative side of the positive power source and the more positive side of the negative power source are connected via lines 509 and 510, respectively, to common mode union 511. The common mode union 511 serves to complete the path of DC current between the positive source 502 and the negative source 503. Thus, power is transmitted in a circuit or "loop" from the positive power supply 502 to the local communications device 505, then back to the negative power source 503, and then from one power source to the other. As described below, the common mode union 511 serves as a convenient "access point" for the ground-fault detection system 512 and the over-current detection system 513 to obtain information regarding the operating of that circuit to perform their respective functions.

In contrast, the over-voltage detection system 514 is connected between the main power transmission lines 507 and 508 via lines 519 and 520, respectively.

The detection system identifying a fault also sends a signal indicating that an event has occurred to the main power supply controller 524 for various purposes, such as maintaining sending instructions to the power supply 501, maintaining a log, advising an operator, etc. Among other things, the main power supply controller 516 may send data to the external system monitor 529 via line 530 to record the fault events detected by any of the ground-fault, over-current and over-voltage detection systems 512, 513 and 514. That is simply a way for the overall system to receive and retain information that something occurred. Although this is represented in FIG. 5 as a "monitor," it can include memory and input and output devices or any of the other things typically associated with the electronic recording, reporting and management of information. Although labeled "external," the system can be located anywhere.

When a fault is detected by any of the systems 512, 513 or 514, the main power supply controller 516 may also cooperate with the local load control 515 to manage the system response to the fault event. This can be effected in a number of ways involving hardware and/or control logic. As described later with respect to one embodiment shown in FIG. 9, the remote load control includes a device commonly called a "one shot" connected to each of the input signal lines from the ground-fault, over-current, and over-voltage detection systems. Sometimes, a "one-shot" is thought of as delaying some action. But the purpose of the one-shot here is to "stretch out" the fault signal for a preset period of time—such as 10 seconds—during which the load control 515 keeps the power transmission circuit open, and power does not flow to the local load 505 or elsewhere in the main circuit. The one-shot repeats this process until the system can resume normal operation without the undesirable event that caused the fault and the resulting interruption in the transmission circuit. Meanwhile in the embodiments of the control processes depicted in the flow charts of FIGS. 10 and 11, the main power supply controller continues to employ certain program logic to monitor the system and determine when it may be viable to re-start power transmission or whether the system should be "shut-down."

A significant advantage of the detection systems is that the controller 524 or any other processor is not involved in identifying a fault or taking immediate action on a fault signal. Action on such a signal does not require computer processing that might delay opening of the relay in response to a fault. It is possible that a processor could be involved in the opening of the gates but this would assume a processor having sufficient speed, capacity and momentary availability so that the relay gates can be opened timely. Embodiments of the technology disclosed herein comprise hard-wired, e.g., analog, protection systems that detect a fault and provide an immediate, effective response when a fault is detected.

As shown in FIG. 5, the ground—fault detection system 512 sends its fault signal to the controller 524 via line 521b, the over-current detection system 513 does this via line 522b, and the over-voltage detection system 514 does this via line 523b. In the embodiment depicted in FIG. 5, the signal sent from each detection system to the controller 524 is the same as the signal that detection sends to the local load control 515. In other words, 521a is the same signal as 521b; 522a is the same as 522b; and 523a is the same as 523b. But that does not need to be the case. These could be separate signals, i.e., having different electronic formats. It is important, however, that signals emanating from the ground-fault, over-current and over-voltage detection systems to the local load control 515 be in a form that they can be acted on by the controller to immediately open relay gates 516a and/or 516b in the event that a fault is detected. In the example as depicted in FIGS. 5 through 9, the hard-wired detection circuits and the local load control—and the absence of any required computer processing of signals—enable this to happen unobstructed by any computer processing elements.

As indicated previously, main power supply controller 524 manages the operation of the adjustable output voltage power supply 501 via line 528. In addition, main power supply controller 524 also provides information to the load control when it desires to turn-off the relay and to disconnect the power supply 501 from the local load 505—apart from the signals sent by the over-voltage, over-current and over-voltage detection systems. This may occur for various preprogrammed reasons. In addition, the controller 524 may also be instructed by an attendant or operator via a switch or other means to send a signal to turn-off the relay and disconnect the power from reaching the load 505.

Table A provides exemplary details for components of the overall system depicted in FIG. 5:

TABLE A

| Item # | Description | Specification. | Part # & Source |
| --- | --- | --- | --- |
| 500 | Power input | DC from power factor correction primary supply | Model CM421-1456G from Jasper Electronics, Anaheim, CA |
| 501 | Power supply | 70-0027 | 70-0027 from Cottonwood Creek Technologies, Inc., Centennial, CO |
| 502 | Positive power source | 0-70 Vdc adjustable power supply (tracking) | 502 is part of 501 |
| 503 | Negative power source | 0-70 Vdc adjustable power supply (tracking) | 503 is part of 501 |
| 505 | Local DC load | Phone/multimedia terminal | 70-0022 from Cottonwood Creek Technologies, Inc., Centennial, CO |
| 524 | Main power supply controller | | 524 is part of 501 control system. |

Unless otherwise noted, these exemplary details for the components in Table A are the same for similarly numbered components in the example embodiments depicted in FIGS. 6-9.

FIGS. 6 through 11, provide further detail regarding embodiments of the detection systems and control logic that might be employed in the example system depicted generally in FIG. 5.

Figure 6:
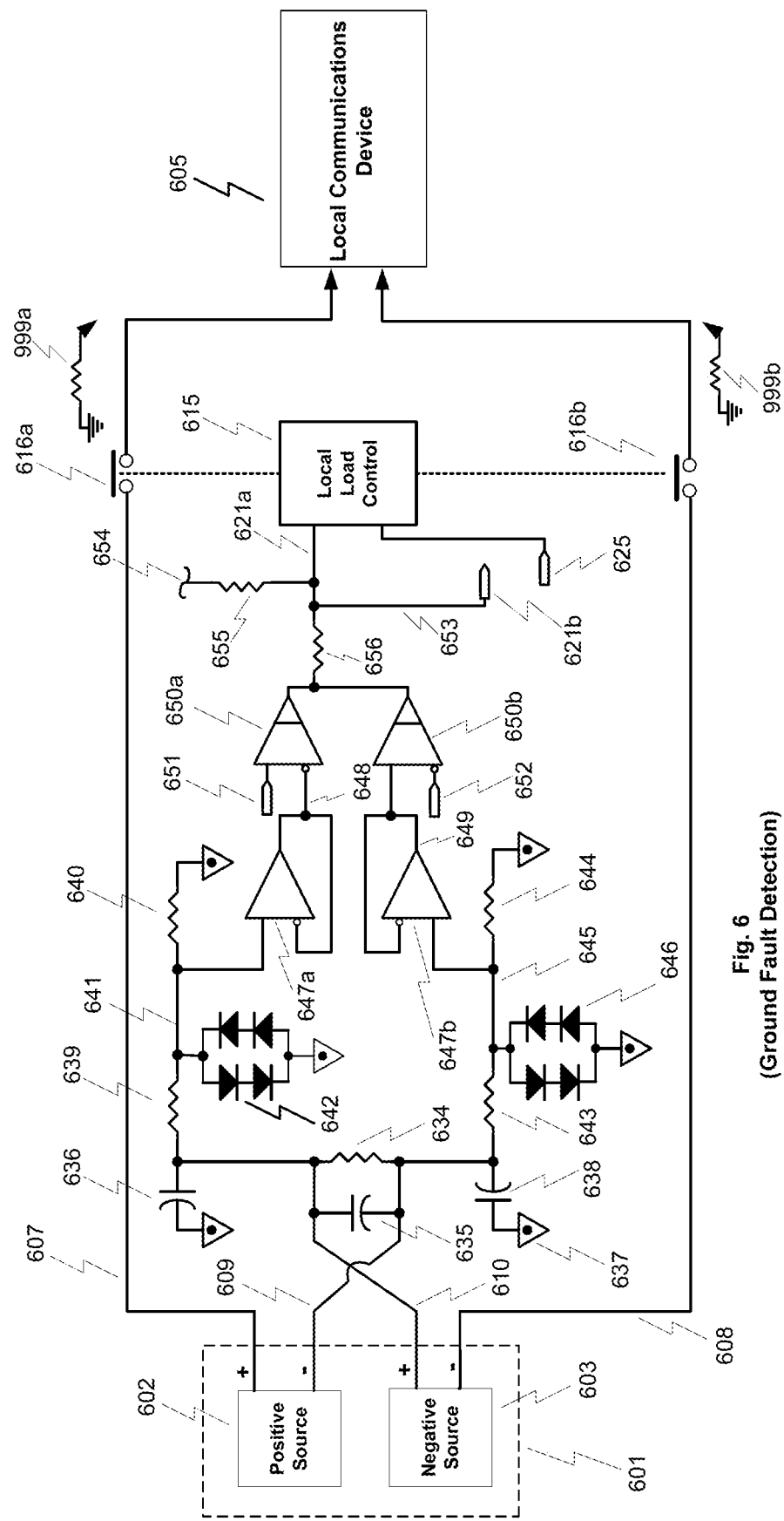
FIG. 6 is a circuit diagram illustrating in more detail one embodiment of a ground-fault protection system shown more generally in FIG. 5.

FIG. 6 is a circuit diagram illustrating in more detail one embodiment of a ground-fault protection system shown more generally in FIG. 5. In addition, FIG. 6 illustrates one embodiment of a circuit for implementing the functional components of the ground-fault protection system of FIG. 2, including, for example, power supply symmetry detection 212a and offset threshold comparator 212b. FIG. 6 also provides more detail regarding circuits and components for one implementation of a common mode union identified generally as 511 in FIG. 5.

The embodiment depicted in FIG. 6 includes a remote power source 601, a local load 605 and a transmission path all as described in connection with the example in FIG. 5. The output of power source 601 can be regulated by an adjustable output power supply (as described in connection with FIG. 5) so that a maximum of 70 volts and 0.4 amps of DC current is transmitted via line 607 from the positive output of the positive power source 602 through relay gate 616a and then to local DC load 605, in this instance the type of local communications device described in connection with FIG. 5. DC current then returns from the local load through relay gate 616b via line 608 to the more negative side of negative power source 603. Lines 607 and 608 provide a total of 140 volts. With the exception perhaps of the relay gates 616a and 616b, the foregoing describes a typical, bipolar DC power transmission loop.

The loop depicted in FIG. 6 is a little more complicated, however, in that current also passes via line 610 from the more positive terminal of the negative power source 603 to the top of resistor 634 and then out of the bottom of the resistor 634 and finally back to the more negative terminal of the positive power source 602 via line 609. This additional portion of the circuit comprises one simple configuration for a "common mode union" in that it connects positive and negative portions of the DC power source 601 via a small resistance so that this "union" of the two power sources can provide access to information useful for systems such as the ground-fault and/or over-current detection systems that need to monitor for undesirable events in the external loop carrying power to and from the remote load. The "common mode union" provides those qualities and other advantages as described herein.

The "common mode union" in FIG. 6 includes what looks like an "X" or a cross-over between the positive output of the negative source and the more negative output from the positive source. Lines 610 and 609 respectively, join these terminals via resistor 634.

Some advantages of the common mode union may be understood by a hypothetical example. Assuming that the total voltage at the external DC load, i.e., at the junction of signals at 607 and 608 necessary for operation of the load would be about 20 volts, then the output voltage should be approximately 10 volts at each of the positive and negative sources depending on the amount of the current in the loop that goes all the way around this entire circuit. A voltage will be developed across resistor 634 depending on the amount of current through the path to and from the local load. Thus, the current in the power transmission loop can be monitored as the voltage across resistor 634. That voltage represents the product of the current in the loop multiplied by the impedance of the resistor. In the embodiment depicted in FIG. 6, resistor 634 has a resistance value of 1 Ohm, 0.5% tolerance (i.e., accuracy). Again, for purposes of the hypothetical example, it is assumed that the loop current is 150 mA. Among other things, this configuration enables measurement of the current through resistor 634 so that a relatively simple scaling factor can be employed subsequently.

As mentioned previously, the ground-fault detection system monitors for symmetry in the overall circuit, more explicitly in the voltages appearing at the more negative terminal of the positive power source as indicated via line 610 and the more positive terminal of the negative source as indicated via line 609. As the power supply is configured in this example, and absent the common mode union, the voltages at 609 and 610 would be completely "floating," i.e., they would appear to have no value relative to earth whatsoever. Using the hypothetical 20V load mentioned previously and a power source of 20 volts, the positive output signal 607 could hypothetically be at +1010 volts and the negative terminal or line 608 at +990 volts. Such an arrangement would not be desirable for detecting asymmetry for purposes of ground-fault protection. Instead, it would be desirable if the upper and lower values of the voltages were centered around a "ground level" just as if they were connected to an earth-centered ground. In such a system, the voltages at 609 and 610 would be of the same magnitude so long as there is no unintended path such as would occur if, for example, an unshielded person touched conductor 607 as indicated at 999*a* or touched the return conductor 608 as indicated by 999*b* in FIG. 6, under circumstances that resulted in an unintended flow of current from the conductor to the ground. With the 150 mA loop current, and resistor 634 having a resistance of 1 Ohm, ideally signal 610 would exhibit about +75 mV while signal 609 would exhibit about −75 mV absent any unintended leakage currents such as 999*a* or 999*b*.

A "ground-fault" situation generally refers to any current that escapes the intended loop or path between the power source and the local load. Examples of ground fault situations 999*a* and 999*b* are not limited to those locations, but can appear anywhere along the loop. The two locations depicted in FIG. 6 are intended merely to indicate that a ground-fault can occur and be detected in either the line carrying current to or the line carrying current from the local load 605.

The connection between power sources 602 and 603 via lines 610 and 609 and resistor 634, provides a "center point" where the ground-fault detection system can monitor for asymmetry when an undesirable event occurs. At the very simplest, the "common mode union" comprises resistor 634 and the connection between the two power sources indicated by the crossed wires 610 and 609.

The other circuitry associated with resistor 634 and thereafter may affect the performance of the common mode union, but strictly speaking is not an essential part of it. The other circuitry also implicates the process of evaluating the power supply symmetry. It is looking for balance and symmetry indicating normal operation. It should be noted that absolutely perfect symmetry in operation is not required, but there would need to be compensation in the detection circuitry to compensate for normal variances in distinction from faults. One possibility is the use of a high threshold for comparing the degree of asymmetry deemed to be indicative of a fault condition.

For this example, the capacitor 635 in FIG. 6 along with capacitors 636 and 638 reduce high frequency noises to keep extraneous noise from getting in to the detection evaluation circuitry. This minimizes the possibility of false detection due to electrical noise.

Also, signals 609 and 610 can be scaled from those at 634 by resistances, for example, those identified as 639 and 640 connected from the top of the resistor 634, i.e., on the more positive sensing side of the detection system, and resistors 643 and 644 connected from the bottom of resistor 634, i.e., on the more negative sensing side of the detection system. As used herein the "more negative sensing side" is connected to the negative terminal of the more positive source and the "more positive sensing side" is connected to the positive side of the more negative source.

Since the value of resistor 634 in the example depicted in FIG. 6 is only 1 Ohm, there is a very small differential voltage across that resistor. A better understanding of how a virtual ground is created can be appreciated by considering the situation if resistor 634 had a momentary value of zero. At that time resistors 639 and 640 would be in parallel with resistors 643 and 644 between the center of the power sources with the resistors being tied to earth—ground as represented, for example, by 637.

Assume for purposes of illustration that the local load 605 has an associated voltage drop of 20 volts. With the resistor combination 639 and 640 in parallel with 643 and 644 to the virtual or earth ground potential, then the voltage on each side of the local load will be one-half of that on each side of the terminals i.e., +10 volts and −10 volts. This is so, provided that there is no unintended path within the loop, i.e., a "ground-fault."

As previously mentioned the value of resistor 634 is small. And it is small compared to any other resistances in the ground-fault detection system. The resistances 639 and 640 are such that they operate as a voltage divider. So the voltage at the junction of components 634, 636 and 639 should be very near zero in normal operation of the circuit. If the current in the loop is not symmetrical on both sides due to the leakage, for example 999*a*, then that voltage at the junction of components 634, 636 and 639 would shift slightly from the zero voltage. Likewise, the voltage at the junction of components 634, 638 and 643 would also shift and in the same direction as the voltage at 634, 636 and 639. The values of resistors 639 and 643 should generally be the same value. Resistors 640 and 644 should have relatively high impedances. In some examples, the total resistance should be high so that even a small ground-fault "leakage" current would cause a relatively large and detectable value change in the voltages, i.e., asymmetry in the voltages, along that divider.

In the example system depicted in FIG. 5, the adjustable output power supply 501 has a maximum total voltage of 140 volts. In the ground-fault detection system depicted in FIG. 6 the benchmark for declaring a "ground-fault" may, for example, be set in the range of approximately 1 milliamp of current leakage. This is more conservative and protective than the international standard of 2 milliamps. Other benchmarks could be used in the system of FIG. 6 to ascertain whether current leakage of a sufficient size has occurred that triggers the ground-fault detection system to declare a fault and to interrupt the transmission of power to the local load.

The ground-fault detection system of FIG. 6 operates as follows to detect and react to a ground-fault situation resulting in a leakage of 1 milliamp of current regardless of where that leakage occurs in the loop between the power supply and the local load as described previously.

In the example depicted in FIGS. 5 and 6, the resistors have been "sized" as follows. As previously noted, resistor 634 is 1 Ohm, 0.5%. Resistors 639 and 643 are 26.700K Ohms at 0.1%. Resistors 640 and 644 are 1.400K Ohms at 0.1% accuracy. The reason for only a 0.5% accuracy for resistor 634 is that its value is only important for providing the common mode union and not for detecting a ground-fault. Resistors 630, 640, 643 and 644 have a 0.1% value because they should accurately detect and reflect the appropriate magnitude of a ground-fault event.

The values of the resistors 639 and 640 and likewise 643 and 644 are chosen so that the total resistance of resistors 639 plus 640 compared to the resistance of resistor 640 alone (and similarly the total resistance of resistors 643 plus 644 compared to the resistance of resistor 644 alone) is in a ratio of 20 to 1. This is one of the parameters considered in selecting these standard "off-the-shelf" resistors with the values of 26.700K Ohms and 1.400K Ohms. As mentioned previously, high accuracy, e.g., 0.1%, of the resistors is also important.

Items 651 and 652 on FIG. 6 represent reference signals that identify the input of a threshold value that will permit no more than 1 milliamp of ground-fault leakage current. In other words 651 and 652 provide the threshold voltage against which the leakage current-generated voltage across the parallel pairs of resistors 639 and 640 and resistors 643 and 644 will be compared. For the implementation of FIGS. 5 and 6, the absolute value of the voltage threshold at 651 and 652 was selected to be 0.600K volts, i.e., 600 millivolts. This value was employed since that is exactly ½ of a high precision voltage source that was available. That voltage source provides 1.200 volts, 0.1%.

Component 650a is a comparator that compares the voltage at 648 relative to threshold signal 651. Similarly, component 650b is a comparator that compares the voltage at 649 relative to threshold signal 652. Various forms of comparators could be selected with the purpose that nothing happens if the reference threshold voltage is not exceeded on either comparator 650a or 650b. But if the reference voltage is exceeded on either comparator 650a or 650b, then a signal will be sent to the load control 658 to open relay gates 616a and/or 616b so that current is immediately shut-off with the loop between the power source and the local load.

The reason for having two comparators is that when there is an external leakage it could be item 999a or it could be 999b on the other side on the power transmission loop as depicted in FIG. 6. Because a leakage can occur on either "side" of the loop, the system must be able to detect either a "positive-going" ground-fault or a "negative-going" ground-fault. This is addressed by having two comparators. One of which 650a looks at the more positive side and the other comparator 650b looks at the more negative side.

In the implementation shown in FIG. 6, the comparators are of the open collector variety. The output 653 of comparators 650a and 650b cooperates with voltage source 654 and resistors 655 and 656 to effect the supply of a ground-fault error detection message 621a to load control 615. If the threshold is not exceeded on comparator 650a or 650b, then signal 621a is pulled up to voltage source 654, via resistor 655, and no message is sent. As implemented in FIG. 6, the voltage source 654 is a 5 volt source, but it could be some other voltage. If either signal 648 or 649 exceeds the threshold at comparator 650a or 650b, they will then clamp the voltage on signal 653 to its relative ground of the power supplies of those comparators. Then the signal 621a is scaled to some portion of the 5 volt source 654 via the resistors 655 and 656 going into "load control."

With a current leakage of 1 milliamp, a scaling ratio of 20:1 versus and a 0.6 volt reference—then the voltage at either end of resistor 634, which is the same as the signals 609 and 610, will be at 12 volts relative to the reference signal 637. With 12 volts going through the sum of resistance of 639, 640, 643 and 644 . . . 639 plus 640 is a total of 28.1 K. Likewise 643 plus 644 is another 28.1K Ohms. But those "strings" of resistors, too, are in parallel, so there effectively is a resistance of 14.05K Ohms. The 12 volt signal divided by 14.050 is 854 micro amps, which is slightly more sensitive than the target threshold of 1 milliamp, i.e., 1000 micro amps. So the actual threshold that is employed in the FIG. 6 example results in a maximum leakage current "cut-off" that is slightly lower than the original 1 milliamp target.

It will be noted that FIG. 6 also includes buffer amplifiers 647a and 647b. So, if the value of the reference voltage in the comparators is +/−600 millivolts, the comparators need to compare that to the value at the junction of 640 and 641, i.e., the inverted input going into 650a. The point is that the buffer amplifiers provide impedance isolation between the junction of resistors 640 and 641, which is going through the buffer amplifier 647a which is a "direct follower," i.e., a gain of 1. This is important so that there is no current being drawn out of the junction of 640 and 641 going to any other electronic circuitry. Item 647a provides a high impedance path of duplicating that voltage at signal 648. Likewise 647b does the same thing for the junction between resistors 643 and 644 buffered by amplifier 647b going into signal 649 to comparator 650b.

It should be noted that diodes 642 and 646 are provided in the circuit to mitigate damage to the circuit components in the event of an extreme situation, for example, where one of the output wires accidentally is cross-connected to a 220 volt AC power line. The values of resistors in the circuit are such that they should not burn out, but they would still permit voltages high enough to damage the integrated circuit. On the other hand, clamping diodes 642 and 646 would protect the integrated circuits from being damaged under those kinds of extreme conditions. The same is true for other clamping diodes shown in the embodiments of FIGS. 7, 8 and 12.

It should be noted also that in FIG. 6, there is another input 625 into load control 615 other than line 621a from the ground-fault detection system. As described in connection with FIGS. 5 and 9, this represents a separate input from the main power supply controller (i.e., 524 on FIG. 5) that may also result in opening of the relay and cessation of current being supplied to the local load 605 and elsewhere.

The comparators 650a and 650b interact with the load control 615 in the following manner. Because of the arrangement of resistors 655 and 656 compared to voltage value 654, if there is no fault, then there will be no current in either of those resistors, so then the voltage value at 653 will be the same as at 654. If there is no current, then there is no fault signal level. However, when there is an imbalance or asymmetry in voltages in the power transmission circuit and that asymmetry results in a value exceeding the threshold at either of these comparators, then the voltage at 653 will go down to the negative bias voltage (not shown) for comparators 650a and 650b—and the relative values of resistors 655 and 656 will set the voltage level at 621a and 621b. If 654 is set to be +5V and the above negative bias voltage (not shown) is set to be −5V, and the resistor 655 and 656 values are the same, then the active, or fault, voltage level at 621a and 621b will be about zero volts.

Figure 7:
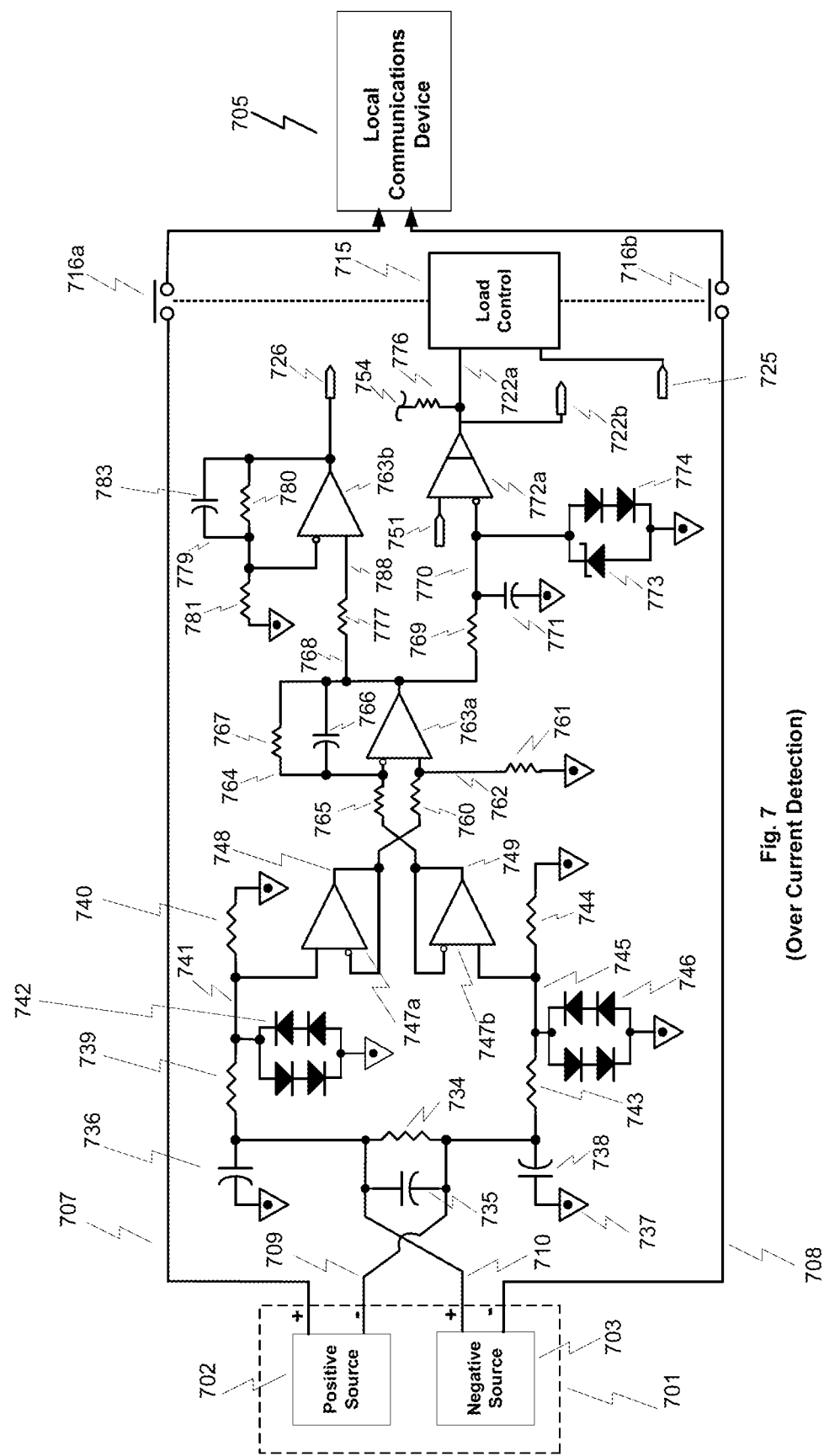
FIG. 7 is a circuit diagram illustrating in more detail one embodiment of an over-current protection system shown more generally in FIG. 5.

In essence the load control is acting on whether it is receiving either the voltage at 654 interpreted as "normal" or "no fault" or it is receiving a fault signal as a result of the comparators indicating an over-threshold condition. It only gets one or the other via signal 621a. When the load control sees a "fault" condition, it trips 616a and/or 616b. The same methodology is employed with respect to signals 722*a* (over-current detection; FIG. 7) and 823*a* (over-voltage detection; FIG. 8).

Table B provides exemplary details for components in the embodiment of the ground-fault detection system in FIG. 6:

TABLE B

| Item # | Description | Specification | Part # & Source |
|---|---|---|---|
| 634 | Resistor in common mode union connecting battery lines. | 1.000 Ω, 0.5%, 50 ppm, ½ W | RNCF2512DTC1R00 from Stackpole Electronics, Raleigh, NC |
| 635 | Capacitor | 10 μF, 10%, 50 V, X7R | C2220X106K5RACTU From Kemet Corporation, Simpsonville, SC |
| 636 | Capacitor | 100 nF, 5%, 160 V, Propylene Film | B32620A5104J from Epcos AG, Munich, Germany |
| 638 | Capacitor | (same as 636) | (same as 636) |
| 639 | Resistor | 26.70 KΩ, 0.1%, 10 ppm, ⅛ W | 1676272-2 from TE Connectivity, Schaffhausen, Switzerland |
| 640 | Resistor | 1.400 KΩ, 0.1%, 25 ppm, ⅛ W | ERA-6AEB1401V from Panasonic Corporation, Osaka, Japan |
| 642 | Diodes | Diode, Dual, Series, 200 mA, 100 V | MMBD4148SE (two each) from ON Semiconductor, Phoenix, AZ |
| 643 | Resistor | (same as 639) | (same as 639) |
| 644 | Resistor | (same as 640) | (same as 640) |
| 646 | Diodes | (same as 642) | (same as 642) |
| 647a | Amplifier, buffer | OpAmp, ±75 μV-os, ±15 pA-ib | ISL28207FBZ-T7A from Intersil, Milpitas, CA |
| 647b | Amplifier, butter | (same as 647a) | (same as 647a) |
| 650a | Comparator | Comparator, ±2 mV-os, ±8 pA-ib | LM393APWR from Texas Instruments, Dallas, TX |
| 650b | Comparator | (same as 650a) | (same as 650a) |
| 651 | Threshold input to comparator 50a | +600 mV | value (not a component) |
| 652 | Threshold input to comparator 50b | −600 mV | value (not a component) |
| 654 | Voltage value input | +5 V | value (not a component) |
| 655 | Resistor | 10 KΩ, 1%, 100 ppm, ⅛ W | RMCF0805FT10K0 from Stackpole Electronics, Raleigh, NC |
| 656 | Resistor | (Same as 655) | (Same as 655) |

Unless otherwise noted, these exemplary details for the components in Table B are the same for similarly numbered components in the example embodiments depicted in FIG. 5 and FIGS. 7-9.

As mentioned previously, there can be no precise assignment of various portions of the ground-fault detection circuit shown in FIG. 6 with the functions identified on FIG. 2. All of the components in the circuit have direct or indirect impact on other components. Since all of the components are connected electronically and their status depends on whether the main circuit is operating normally or under a fault situation, none of the components acts in isolation; they all act together.

FIG. 7 is a circuit diagram illustrating in more detail one embodiment of an over-current protection system shown more generally in FIG. 5. In addition, FIG. 7 illustrates one embodiment of a circuit for implementing the functional components of the over-current protection system of FIG. 3, including, for example, current to voltage converter and scaler 313*a* and maximum threshold comparator 313*b*. In addition, the circuitry depicted in FIG. 7 includes features to monitor current in the power transmission loop and to provide an output to the main power supply controller 524 of FIG. 5. This current monitoring function is not necessary for the detection of an over-current fault.

The over-current detection system shown in FIG. 7 should be viewed in the context of the example system depicted in FIGS. 5 & 6. FIG. 7 includes a number of elements common to FIG. 5. This includes the symmetric bifurcated power supply 701, the main circuit carrying current from that bifurcated power supply to the local DC load 705, elements of the common mode union, the load control 715 and relay gates 716*a* and 716*b*. It does not show others, such as, the controller or the circuitry associated with the ground-fault detection or the over-voltage detection systems.

An advantage of the circuit depicted in FIG. 7 is that it employs a number of the same components as the ground-fault detection system in FIG. 6. Indeed everything to the left of signals 748 and 749 in FIG. 7, i.e., the output from buffer amplifiers 747*a* and 747*b*, respectively, is the same as in FIG. 6. The components as described can be virtually identical in FIGS. 6 and 7. The sharing of components in the ground-fault detection system and the over-current detection system provides efficiency and economy without impairing the performance of either system.

As previously mentioned, the impedance of resistor 734 is important in the operation of the ground-fault detection system in FIG. 6. It is also important in the over-current detection system of FIG. 7. In this case, the value of 734 directly affects the conversion of the value of the current in the transmission loop to a voltage value accurately reflecting that current. This is desirable, since it is much easier to measure voltage than current. So where there is a variance from normal in the current in the transmission loop, it can best be detected by the associated variance in voltage.

Again, the value of resistor 734 is important in the conversion and scaling of information for the over-current detection system. It is particularly convenient in the context of a POTS communications system. This is so, because most existing POTS communication circuits that use DC power to enable a standard telephone use 24 American wire gauge copper conductors that are rated at a maximum current of 400 milliamps. In such a context, as exhibited in the example of FIG. 5, the over-current detection system is employed to determine whether the current in the power transmission loop from the power supply 701 to the local load 705 and back has exceeded 400 milliamps. In other words, the fault threshold was chosen to match the 24 AWG current handling capability, knowing that the intended use of the circuit in the example would likely not require the level of current in order to both protect the 24 AWG wiring outside of physical system direct control. In other situations, the threshold might be set to meet other objectives.

For purposes of understanding the design and operation of the over-current detection, it is assumed that there is a hypothetical current of 400 milliamps in the power transmission circuit. With resistor 734 having a rating of 1 Ohm, there will be a voltage of 400 millivolts across that resistor when the there is a 400 milliamp current in the loop. Relative to the virtual ground 737, the 400 millivolts across resistor 734 would appear as +200 millivolts at the junction of 736, 739 and 734 and as −200 millivolts at the junction of 738, 743 and 734. In essence, the voltage is representative of the current, and in that sense, this system serves as a current-to-voltage converter where the numerical value of the resultant voltage has a 1:1 correspondence with the value of the current when using appropriate units of measurement.

With the resistor pairs 739 and 740, and 743 and 744, having the resistances previously indicated, the voltages entering buffer amplifiers 747a and 747b will be $\frac{1}{20}^{th}$ of the values noted at the junction of 736, 739 and 734 and the junction of 733, 743, and 734, respectively. So instead of being 200 millivolts, these voltages will be +10 millivolts at signal 741 and −10 millivolts at signal 745. These are then buffered through buffer amplifiers 747a and 747b previously described in connection with FIG. 6. The output of each amplifier will have the same voltage as the signal had at the input of each. Thus, in the example, the signal at 748 will be +10 millivolts, and the signal at 749 will be −10 millivolts.

It should be noted that up to this point the over-current detection system depicted in FIG. 7 shares the same components and circuitry as the ground-fault detection system depicted in FIG. 6. The shared signals 648 (FIG. 6), which is 748 (FIG. 7), and 649 (FIG. 6), which is 749 (FIG. 7), serve as inputs to both the ground-fault detection system and the over-current detection system; but they are processed separately thereafter by each system to achieve the individual detection purpose.

With respect to the over-current detection system in FIG. 7, signals 748 and 749 enter an amplifier system composed of operational amplifier 763, resistors 767, 765, 760 and 761, all of whose values were chosen so that there is a total combined gain of 30. The +10 millivolt and −10 millivolt inputs into amplifier 763 together have a difference of 20 millivolts. The single signal 768, leaving the amplifier 763 will be 30 times that magnitude, i.e., 600 millivolts. Since this is the value corresponding to the maximum permitted 400 milliamps of current in the loop, that value can be applied as the threshold value 751 used for comparison purposes later.

Signal 768 may be used for several purposes. The essential purpose is for over-current detection. Thus, signal 768 (for example +600 mV when the loop current reaches 400 mA) passes through resistor 769. Resistor 769 has an impedance of 1 K Ohm, and there is essentially no current going through it. Resistor 769 in concert with capacitor 771 provides a smoothing filter that may in some applications exclude the system from tripping for what should be considered a "false alarm," e.g. a lightning strike in the general area that does not directly hit the circuit but affects the electrical environment. The exiting signal 770 provides a voltage input (for example +600 mV when the loop current reaches 400 mA) into threshold detector 772 that compares that signal to the 600 millivolt reference threshold supplied at 751. Since it is an open collector comparator, the output 775 of the comparator 772 is normally "pulled up" by resistor 776 to the voltage value of 754. With less than the hypothetical 400 milliamp current flowing in the power transmission loop, the load control 715 receives the value established by 754. But if the 400 milliamps in the loop is exceeded, then the signal at 770 will exceed the reference 751, and signal 775 going into the load control will "go low." The load control 715 recognizes this signal and immediately turns off relay gates 716a and/or 716b, thereby disconnecting the power supply 701 from the load 705. An over-current situation has been detected by the circuitry in FIG. 7, and action to disconnect the main circuit has been effected immediately, e.g., within several milliseconds.

Because the over-current detection system includes hard-wired components, there is no need for any computer processing activity to determine that there is an over-current fault and to take action in terminating power transmission to the local load. Nevertheless, at the same time that the over-current detection system sends a fault signal 722a to the local load control, the same fault signal is also sent via line 722b to the main power supply controller 524 (FIG. 5), where it can be used in a number of ways such as, for example, those depicted in the control logic charts of FIGS. 10 and 11.

The foregoing description of the over-current detection system assumed a maximum allowable power transmission loop current of 400 milliamps. One skilled in the art would understand that the detection system could be employed to define an "over-current" fault at a lower or higher level. This could be accomplished by adjusting resistor values that affect "scaling" and/or by establishing a different threshold value input 751 at threshold comparator 772.

As depicted in FIG. 7, signal 768 may also be used for another purpose, i.e., to supply the value of loop current in the power transmission circuit to the main power supply controller 524 for monitoring operations and for controlling operation of the adjustable output voltage power supply. To accomplish this, signal 768 passes through input resistor 777 resulting in signal 788 that then enters an amplifier based on operational amplifier 763b, feedback resistor 780, and a scaling resistor 781. Effectively this is a positive gain amplifier (rather than an inverting amplifier) so that the gain of that circuit is 1 plus the ratio of resistor 780 to resistor 781 plus 1. In the illustrated example, the resistor ratio at this time is 5.666, which plus the 1, results in a total gain of 6.666. This results in a scaled analog voltage at signal 782 proportional to the current in the loop supplying power from the power source 1″ to the local DC load 705 and back. Among other things, the current information supplied by signal 782 can be used by the main power supply controller 524 in the control logic charts of FIGS. 10 and 11.

The current detection and feedback system to the controller as described in the preceding paragraph is ancillary to the over-current detection system depicted in FIG. 7. It is not a part of the over-current detection system per se, but provides a by-product measurement for monitoring and other purposes. Loop current detection and feedback to the controller could be provided in any number of other ways known to one of ordinary skill in the art.

The embodiment of the over-current detection circuit as depicted in FIG. 7 depicts an example of one form of over-current hardware circuitry that provides the functionality shown in FIG. 3. It is not possible to precisely and uniformly identify the components of FIG. 7 corresponding with the functional blocks in FIG. 3, since all of the components are connected electronically and affect one another. Individual components may be identified as being part of one functional unit as well as others depending on various factors.

Notwithstanding those caveats, a rough correspondence is as follows. The components of the common mode union previously referenced in connection with FIG. 6 include the connection between the positive and negative DC sources comprising 709, 710 and resistor 734 as may be impacted by components 735, 736, 739, 740, 741, 742, 747, 743, 745 and/or 746, the result of which is signals 748 and 749.

These components also cooperate with 760, 761, 763, 765 and 767 as identified on FIG. 7, all of which assist in converting the magnitude of the current in the loop to a voltage representative of that current as identified in functional box 313a in FIG. 3.

The function of maximum threshold comparator identified as 313b in FIG. 3 includes item 772 in FIG. 7, which compares the voltage of signal 768 after passing through resistor 769 with the threshold voltage value provided by 751 and resulting in output signal 775 going to the load control.

Table C provides exemplary details for components of the embodiment of the over-current detection system depicted in FIG. 7:

TABLE C

| Item # | Description | Specs. | Part # & Source |
|---|---|---|---|
| 742 | Diodes, bipolar clamp | Diode, Dual, Series, 200 mA, 100 V | MMBD4148SE (two each) from ON Semiconductor, Phoenix, AZ |
| 746 | Diodes, bipolar clamp | (same as 742) | (same as 742) |
| 754 | Voltage value input | +5 V | value (not a component |
| 760 | Resistor | 10 KΩ, 1%, 100 ppm, ⅛ W | RMCF0805FT10K0 from Stackpole Electronics, Raleigh, NC |
| 761 | Resistor | 301 KΩ, 1%, 100 ppm, ⅛ W | RMCF0805FT301K from Stackpole Electronics, Raleigh, NC |
| 763a | Amplifier, differential | OpAmp, ±75 μV-os, ±15 pA-ib | ISL28207FBZ-T7A from Intersil, Milpitas, CA |
| 763b | Comparator | Comparator, ±2 mV-os, ±8 pA-ib | LM393APWR from Texas Instruments, Dallas, TX |
| 765 | Resistor | (same as 760) | (same as 760) |
| 766 | Capacitor | 100 nF, 10%, 50 V, X7R | C0805C104K5RACTU from Kemet Corporation, Simpsonville, SC |
| 767 | Resistor | (same as 761) | (same as 761) |
| 769 | Resistor | 1.00 KΩ, 1%, 100 ppm, ⅛ W | RMCF0805FT1K00 from Stackpole Electronics, Raleigh, NC |
| 771 | Capacitor | 10 μF, 10%, 10 V, X7R | CL21B106KPQNFNE from Samsung Electro-Mechanics, Gyeonggi-do, South Korea |
| 772a | Comparator | Comparator, ±2 mV-os, ±8 pA-ib | LM393APWR from Texas Instruments, Dallas, TX |
| 773 | Diode | Diode, signal/clamp, 500 mA, 40 V | CMDSH05-4 from Central Semiconductor, Hauppauge, NY |
| 774 | Diodes | Diode, Dual, Series, 200 mA, 100 V | MMBD4148SE from ON Semiconductor, Phoenix, AZ |
| 776 | Resistor | (same as 765) | (same as 765) |
| 777 | Resistor | (same as 769) | (same as 769) |
| 780 | Resistor | 40.2 KΩ, 1%, 100 ppm, ⅛ W | RCMF0805FT40K2 from Stackpole Electronics, Raleigh, NC |
| 781 | Resistor | (same as 765) | (same as 765) |
| 783 | Capacitor | 10 nF, 10%, 50 V, X7R | CC0805KRX7R9BB103 from Yageo Corporation, Taiwan, China |

Unless otherwise noted, these exemplary details of the components in Table C are the same for similarly numbered components in the example embodiments depicted in FIGS. 5-6 and FIGS. 8-9.

FIG. 8 is a circuit diagram illustrating in more detail one embodiment of an over-voltage protection system shown more generally in FIG. 5. In addition, FIG. 8 illustrates one embodiment of a circuit for implementing the functional components of the over-voltage protection system of FIG. 4, including, for example, voltage scaler 414a, differential amplifier 414b, and maximum threshold comparator 414c.

FIG. 8 includes a number of elements common to FIG. 5. It does not show others, such as, the main power supply controller or the circuitry associated with the ground-fault detection or the over-current detection systems. To provide context, FIG. 8 includes symmetrical, bifurcated power source 801 including a positive source 802 and a negative source 803. Again, power flows through 807 from the more positive terminal of the positive source 802, through relay gate 816a to local load 805 and back through relay gate 816b and line 808 to the more negative terminal of the negative power source 803. To complete the circuit the more positive side of the negative source and the more negative terminal of the positive power source are connected via a common mode union including resistor 834. Unlike its role with respect to the ground-fault and over-current detection systems, the common mode union as illustrated by FIG. 8 does not act as an access point for information needed by the over-voltage detection system.

As generally illustrated in FIG. 4, the over-voltage detection system 414 comprises a voltage divider or scaler 414a, followed by a differential amplifier 414b and a maximum threshold comparator 414c. As a "by-product" of the over-voltage detection system, the circuitry depicted in FIG. 8 also includes features to monitor voltage in the main loop and to provide an output 827 representing that voltage to the main power supply controller 524 of FIG. 5.

The voltage dividers shown in FIG. 8 comprise resistors 884, 885, 886, 887, 888, and 889 along with a mid-point ground reference connection MPG between resistors 886 and 887. This arrangement could be thought of as two resistor-dividers: the first divider being resistors 884, 885, and 886 attached at 819 to the transmission line 807 from the more positive terminal of the positive power source 802 and the second divider being resisters 887, 888, and 889 attached at 820 to the transmission line 808 to the negative side of the negative power source 803.

For purposes of understanding the design and operation of the over-voltage detection system, it is assumed that the adjustable output power supply 801 of the example is set for a maximum total of 140 volts. As mentioned in connection with FIG. 4, it is helpful in designing the over-voltage detection system to scale that down to something that would be suitable for use by comparator 872b in comparison to the reference standard 851. For example, the resistors in the dividers could be selected so that the voltage levels at 819 and 820 would be scaled down by a factor of 35.

This can be accomplished by using 330.0K, 0.1 percent resistors for components 884 and 889 and 10.00K Ohm resistors, 0.1 percent resistors for components 885, 886, 887 and 888. As a result, the ratio of 884 and 885 plus 886 to resistor 886 alone (i.e., as those components act as the first divider) would be 35:1, so the voltage at signal 890 would be $\frac{1}{35}^{th}$ of whatever the voltage is at 819 at any time. Similarly, the ratio of resistors 889 and 888 plus 887 to resistor 887 alone (i.e., as those components act as the second divider) would also be 35:1, so the voltage at signal 891 would be $\frac{1}{35}^{th}$ of whatever the voltage is at 820. Thus, when the system in the example is delivering a full 140 volts to the load, the signal at 819 would ordinarily be +70 volts, which would be scaled down by the first divider to +2 volts at 890, and the signal at 820 would ordinarily be −70 volts, which would be scaled down by the second divider to −2 volts at 891.

The embodiment of the over-voltage detection circuit as illustrated in FIG. 8 depicts an example of one form of over-voltage circuitry that provides the functionality shown in FIG. 4. It is not possible to precisely and uniformly identify the components of FIG. 8 corresponding with the functional blocks in FIG. 4, since all of the components are connected electronically and affect one another. Individual components may be identified as being part of one functional unit as well as others depending on various factors.

With that caveat, the things mentioned so far in the over-voltage detection system would comprise the voltage scaler 414*a* shown generally on FIG. 4. Other methods of scaling the signals at 819 and 820 would be known to one of ordinary skill in the art.

The buffered differential amplifier 414*b* shown generally on FIG. 4 is primarily comprised of 892*a*, 892*b*, 895, 896, 897, 898, 899 and the noise reduction capacitor/roll-off capacitor 8103. The values of the resistors 895, 896, 897, and 908 are all also 10.00K, 0.1 percent. The resistance that would be seen on the voltage divider—were it not for the buffer amplifiers 892*a* and 892*b*—would be an additional 10K load which would change the divider scale. So the buffers 892*a* and 892*b* are included in the circuit simply to isolate and prevent any loading on the voltage dividers 884 through 889. In operation of the example circuit to deliver 140 volts to the load, the voltage at 819 is +70.0 volts and the voltage at 820 is −70 volts. Divide each of those by 35, the voltage at 890 and at 893 will then be +2 volts. The voltage at 891 and 894 will be −2 volts.

Preferably, the differential summing amplifier 899 and its associated resistors are set up to add the signal at 893 to the signal at 894 with a simple gain of 1. Thus, in the example of a 70 volt power supply, the summing amplifier will add the two signals at 8100 (+2 volts) and 8101 (−2 volts), so the voltage then after the differential amplifier sums those two signals will be 4.0 volts.

It should be noted that the choice in this case of the 4 volts is intentional, because part of the system includes an analog to digital converter that has a reference of 4.096 volts. Accordingly, for convenience of the design, the voltage at 102 should be less than 4.096 but near maximum to get the best resolution. If the design of the circuit were something other than the +70 and −70 for a total of 140 volts, then the divider string (430 on FIG. 4) would be likely to be chosen for some value other than 35. If, for example, the voltage were doubled, then it would be reasonable to divide, i.e., "down-scale" by 70. In other words, it would be convenient to intentionally pick a scaling factor so that the total would be 4 volts at whatever the maximum design voltage is for the transmission circuit.

The signal from the output of amplifier 899, i.e., the signal at 827, can be used in two ways.

First, for purposes of the over-voltage detection, the output signal from 899 proceeds through the combination of components 8104 and 8105 before entering the maximum threshold comparator 872*b*. (It should be noted that comparators 772*a* [FIG. 7] and 872*b* [FIG. 8] are part of a dual unit as identified in Tables C and D.) Resistors 8104 and 8105 are designed so that the signal from 899 is scaled down to be consistent with the reference over-voltage threshold signal of 600 millivolts at signal 851. This can be achieved by dividing the signal at 827 by a factor of 6.76. Thus, if the signal at 827 is 4 volts corresponding to the maximum voltage of 70 volts on the loop, the signal at 8106 will be 591 millivolts, approximately the same as the reference standard of 600 millivolts. This final scaling down can be achieved, for example, if the impedance at 8104 is a 5.76K, 0.1 percent accuracy resistor and the impedance at 8105 is a 1.00K, 0.1 percent accuracy resistor. The capacitor 8107 is simply a noise rejection or smoothing filter capacitor.

To "trip" the comparator 872*b* the voltage in the loop as measured across 819 and 820 would be a total of about 142 volts from 819 to 820 rather than the normal 140. Then the processed signal at 827 would be slightly greater than 4 volts and after going through the divider 8104 and 8105 would exceed 600 millivolts at 8106. This would cause comparator 872*b* the open collector to pull low over-riding the default pull up resistor 8109 which ordinarily would pull up the signal to the voltage of 854. Signal 823*a* would go down to a logic 0 going into the load control and immediately turning off relay 816*a* and/or 816*b* opening one or both contacts and preventing current from flowing in the loop. The same signal 823*b* is sent as a fault signal to controller 524 (FIG. 5) for various purposes including without limitation those mentioned in connection with FIGS. 10 and 11.

Second, the signal 827 is an indication of the present voltage at which the system is operating to deliver power to the local load 805. As such, signal 827 can be fed back to the main power supply controller 524 (See 527, FIG. 5) to monitor the loop and to use the information for various purposes, for example, to adjust the output of power supply 801 or otherwise in the decision making network.

Table D provides exemplary details for components of the embodiment of the over-current detection system depicted in FIG. 8:

TABLE D

| Item # | Description | Specs. | Part # & Source |
|---|---|---|---|
| 872b | Maximum threshold comparator. | Comparator, ±2 mV-os, ±8 pA-ib | LM393APWR from Texas Instruments, Dallas, TX |
| 884 | Resistor | 330.0 KΩ, 0.1%, 25 ppm, ⅛ W | RG2012P-334-B-T5 from Susumu Company, Minami-Ku, Japan |
| 885 | Resistor | 10.00 KΩ, 0.1%, 25 ppm, ⅛ W | RG2012P-103-B-T5 from Susumu Company, Minami-Ku, Japan |
| 886 | Resistor | (same as 885) | (same as 885) |
| 887 | Resistor | (same as 885) | (same as 885) |
| 888 | Resistor | (same as 885) | (same as 885) |
| 889 | Resistor | (same as 884) | (same as 884) |
| 892a | Amplifier, buffer | OpAmp, ±75 μV-os, ±15 pA-ib | ISL28207FBZ-T7A from Intersil, Milpitas, CA |
| 892b | Amplifier, buffer | (same as 892a) | (same as 892a) |
| 895 | Resistor | 10.00 KΩ, 0.1%, 25 ppm, ⅛ W | RG2012P-5111-B-T5 from Susumu Company, Minami-Ku, Japan |
| 896 | Resistor | (same as 895) | (same as 895) |
| 897 | Resistor | (same as 895) | (same as 895) |
| 898 | Resistor | (same as 895) | (same as 895) |
| 899 | Amplifier, differential | OpAmp, ±75 μV-os, ±15 pA-ib | ISL28207FBZ-T7A from Intersil, Milpitas, CA |
| 8103 | Capacitor | 10 nF, 10%, 50 V, X7R | CC0805KRX7R9BB10 Yageo Corporation, Taiwan, China |
| 8104 | Resistor | 5.76K, 0.1 percent accuracy | RMCF0805FT243K parallel with RG2012P-5901-B-T5 from Stackpole Electronics, Raleigh, NC and Susumu Company, Minami-Ku, Japan |
| 8105 | Resistor | 1.000 KΩ, 0.1%, 25 ppm, ⅛ W | RG2012P-102-B-T5 from Susumu Company, Minami-Ku, Japan |

TABLE D-continued

| Item # | Description | Specs. | Part # & Source |
|---|---|---|---|
| 8107 | Capacitor | 10 µF, 10%, 10 V, X7R | CL21B106KPQNFNE from Samsung Electro-Mechanics, Gyeonggi-do, South Korea |
| 8108 | Resistor | 10 KΩ, 1%, 100 ppm, ⅛ W | RMCF0805FT10K0 from Stackpole Electronics, Raleigh, NC |

Unless otherwise noted, these exemplary details of the components in Table D are the same for similarly numbered components in the example embodiments depicted in FIGS. 5-7 and FIG. 9.

Figure 9:
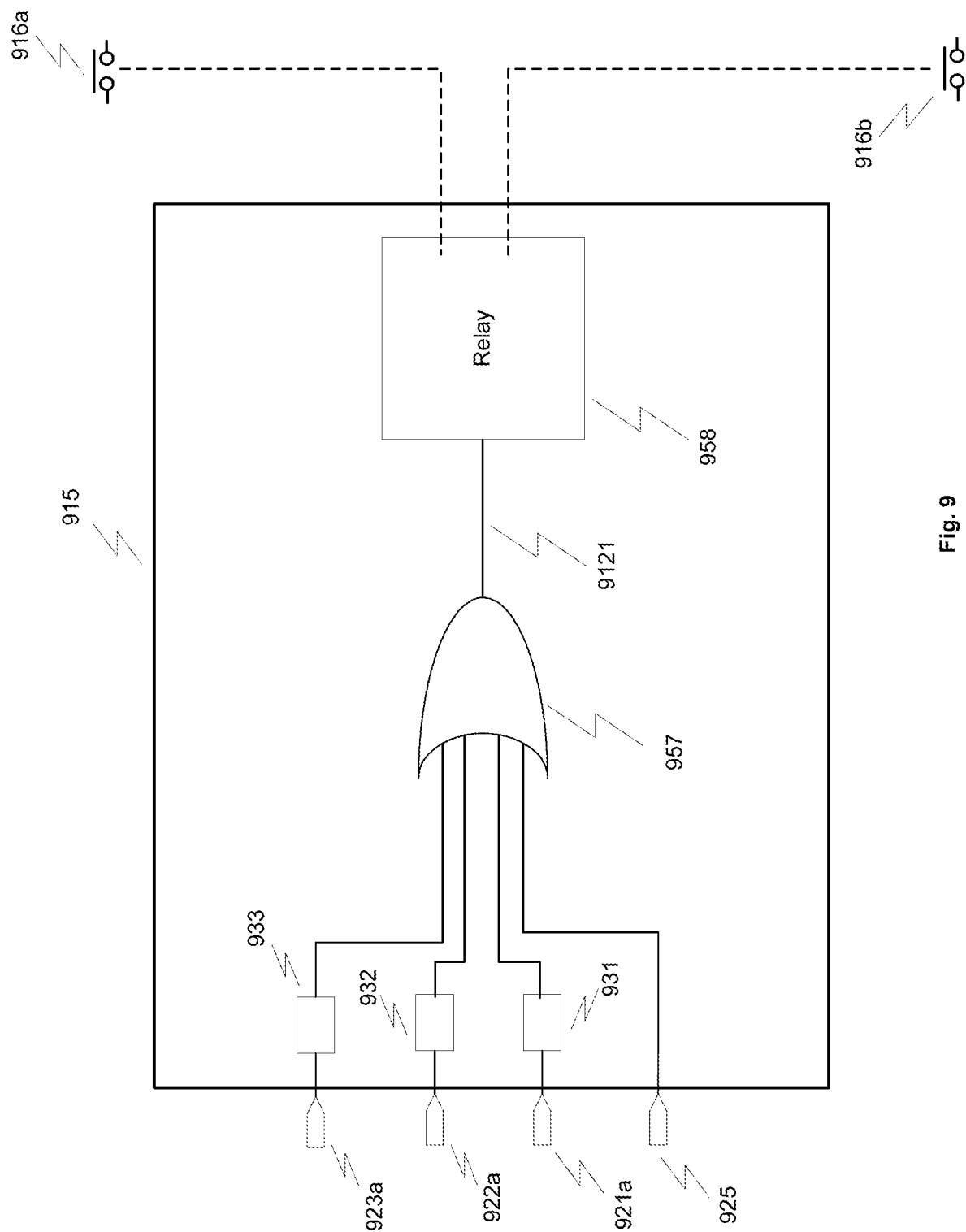
FIG. 9 is a diagram illustrating one embodiment for executing the load control in the example system depicted in FIG. 5.

FIG. 9 is a diagram illustrating one embodiment of executing the load control 515 of the example depicted generally in FIG. 5.

As indicated previously, each of the detection systems sends a fault message to the load control upon detecting an undesirable condition in the circuit. The load control 915 receives input 921a from the ground-fault detection system, input 922a from the over-current detection system, and input 923a from over-voltage detection system. As previously described, each of signals 921a, 922a and 923a will be either a baseline signal representing normal conditions in the power transmission loop or an alternate, i.e., a fault, signal indicating that the detection system from which the signal has been sent has found a problem of a magnitude requiring that power transmission should be immediately interrupted. Baseline signals on inputs 921a, 922a and 923a do not trip the "OR" gate 957. But fault signals do.

In addition, the load control responds to a signal 925 from the main power supply controller 524. This is a "control" signal by which the controller 524 can deliberately open or close the relays 516a and/or 516b. This may as a follow-up to a fault signal or part of the routine operation of the power transmission system Before entering the OR gate 957, however, each of the fault signals on 921a, 922a and 923a passes through a separate "one-shot" or multi-vibrator that will create or provide a short time extension. Signal 921a passes through one-shot 931, signal 922a passes through one-shot 932 and signal 923a passes through one-shot 933. The time extension provided by the one-shots may be the same or each one-shot may have its own time period. In the example depicted in FIG. 9, the time extension is 10 seconds for each of the ground-fault, over-current and over-voltage one-shot's 932, 932, and 933, respectively.

The purpose of the one-shot is basically three-fold. First, the time extension prevents the power transmission circuit from being immediately re-energized or re-starting after the relay is initially tripped. Without this, the circuit could rapidly and repeatedly cycle through "on" and "off" status which could create error conditions, cause improper readings, or result in other distortion problems. Second, the time extension permits a possible correction of the situation that caused the initial error. For example, if an unprotected person touches one of the transmission wires resulting in a leakage of current to the ground, the automatic cut-off of the current by the ground-fault protection circuit and the resulting extension caused by the one-shot might enable the individual or others to perceive a problem (if one exists) and to disassociate the individual from contact with an unshielded portion of the circuit. Third, the extension also allows the control system to take appropriate action, for example, to further disable the transmission circuit so that when the time extension caused by the one-shot ends, the circuit will not be re-enabled automatically.

Having passed through their respective "one-shots," signals 921a, 922a and 923a enter what is known as an electrical "OR gate" 957. An OR logic gate determines that if any of these signals is a fault signal, the "OR" gate will immediately interrupt the transmission circuit. This is accomplished by the "OR" gate's sending a signal 9121 to disabling relay 958 thereby opening gates 916a and 916b.

Apart from reacting to a fault signal on 921a, 922a or 923a, an "over-riding" signal 925 can be sent by controller 924 to the load control 915 directing the "OR" gate 957 to disable the rely 958 and to open the gates 916a and 916b.

The use of relay 958 is important in minimizing the response time from the occurrence of an undesirable event in the circuit to the interruption of power transmission in the main circuit. Embodiments of the detection circuits described herein have the advantage of employing hard wired circuits for monitoring, evaluating and responding to ground-fault, over-current and over-voltage situations. The detection systems do not rely on slower processes that require computer processing in whole or in part for any or all of those functions. As a result, prompt and effective action can be taken in response to an undesirable event.

In preferred embodiments of the technology, relay 958 is a coil driver, whether optical or mechanical, that physically disconnects the power transmission by opening gate 916a on the positive transmission line (see 507 on FIG. 5) to the local load and opening gate 916b on the more negative transmission line (see 508 on FIG. 5) to the local load. Although it might be inferred from the drawings that 507 and 508 are some distance apart, in most practical installations, these lines would be adjacent one another or even part of the same insulated two-conductor cable. Thus, 916a and 916b may be part of the same device. In an example embodiment, gates 916a and 916b form a "double pole" relay with contact 916a being the positive lead or $K_p$ and 916b being the negative lead or "$K_n$." In some examples, both contacts or gates are opened to ensure that power transmission is effectively interrupted, but it is possible to interrupt power transmission by just opening one gate.

Table E provides exemplary details for components of the load control in FIG. 9:

TABLE E

| Item # | Description | Specs. | Part # & Source |
|---|---|---|---|
| 916a | Relay (controlled contacts) | 1A, 250 V, Form A | CPC1726Y from IXYS Corporation, Milpitas, CA |
| 916b | Relay (controlled contacts) | (same as 916a) | (same as 916a) |
| 931 | Multivibrator ("One Shot") | Monostable timer | NE556DR from Texas Instruments, Dallas, TX |
| 932 | Multivibrator ("One Shot") | (same as 932) | (same as 932) |
| 933 | Multivibrator ("One Shot") | (same as 932) | (same as 932) |
| 957 | "OR" gate function | (wired-OR, diodes, 100 V) | MMBD4148CC (two each) from ON Semiconductor, Phoenix, AZ |
| 958 | Relay | 1A, 250 V, Form A | CPC1726Y from IXYS Corporation, Milpitas, CA |

Unless otherwise noted, the exemplary details of the components in Table E are the same for similarly numbered components in the example embodiments depicted in FIGS. 5-8.

FIG. 9 represents one way of causing an immediate cessation of current in the circuit when any of the three detection circuits reports an error condition. There are other ways to implement this that would be known to one of ordinary skill in the art, but the key design points include immediacy of disablement and a time extension before re-initiating current.

Figure 10:
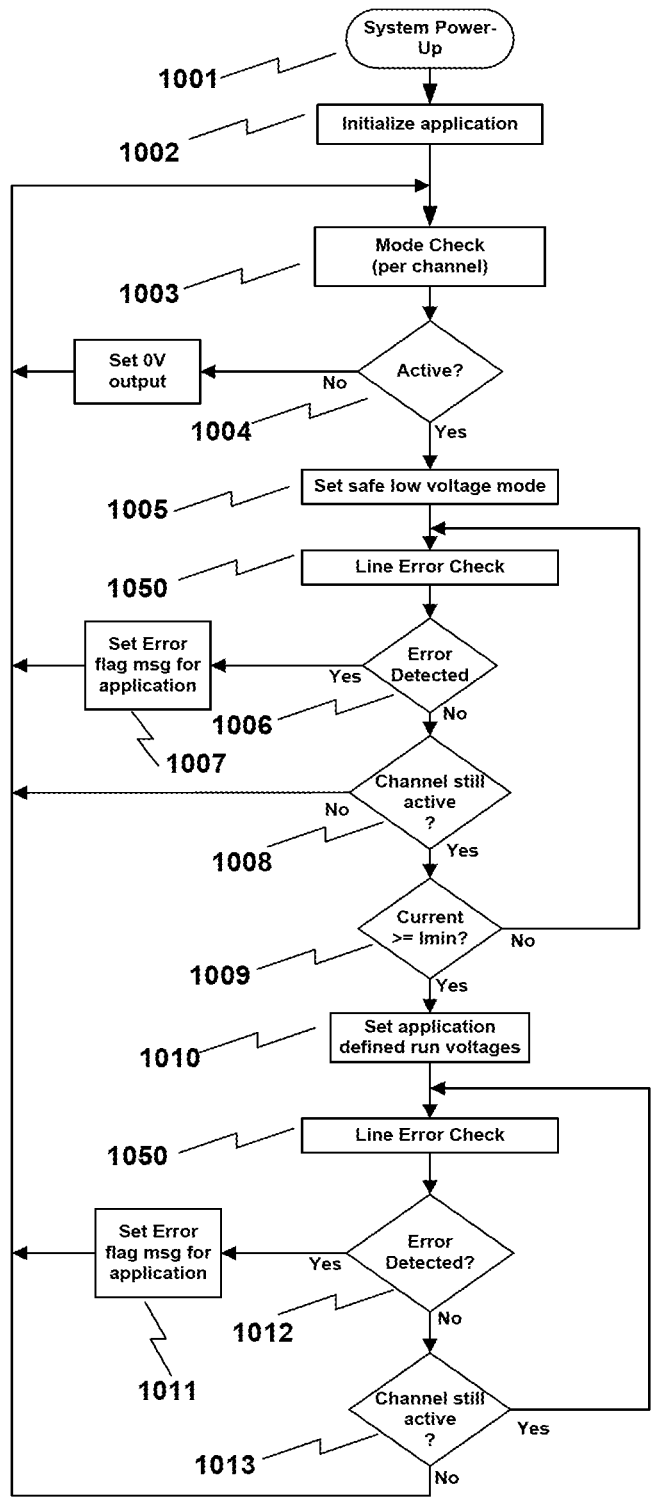
FIG. 10 is a high level flow chart depicting one embodiment of appropriate master control logic for operating the example system depicted in FIG. 5.

FIG. 10 is a high level flow chart depicting one embodiment of appropriate master control logic for operating the example detection systems depicted in FIGS. 5-9. The logic of the flow chart may be executed on computer processor(s) of the main power supply controller, which is referenced as item 524 on FIG. 5. It should be noted first that operation of the flow chart assumes that an installer has set up a system such as shown in FIG. 5 using a safe operation, e.g., very low voltage, mode. Second, as illustrated in the embodiment depicted on FIG. 10 the flow chart logic is implemented on a channel-by-channel basis when considering the transfer of power from a power supply such as 501 to multiple local loads such as 505 via multiple channels.

The process begins at 1001, e.g., system "power up." (Note: The reference numbers used on the process flow charts in FIG. 10 ("1000"-series numbers) and FIG. 11 ("1100"-series numbers) have no relationship to the reference numbers used for hardware components on FIGS. 1-9 and 12.) The first operation 1002 comprises initialization of the system including, for example, initialization of associated memory and input/output ("I/O") devices and the placement of all other supporting hardware and software programs into "active" status.

Sequentially then at 1003 there is a first, i.e., "mode" check, to make sure that the channel is running, i.e., that it is "active." That is basically accomplished by looking for a "flag" that is set indicating that the channel is available to be powered-up and evidences no problems at this point. In one method, operation 1003 looks at a database that contains the information indicating whether the channel can be powered up.

At 1004 a decision is made regarding whether the channel is in "active" mode. If the answer is "no," the output voltage of the power supply for that channel is reset to make sure that it is set to zero. This is accomplished via communication between the main power supply controller 524 and the adjustable output power supply 501. Then the program loops back to process at 1003 to determine whether at some point the channel becomes active.

If the determination is made at 1004 that the channel is active, the process proceeds to the operation at 1005 which is to set the output voltage from the power supply to a safe low voltage mode, for example, something that is generally less than 12 volts and may be in the range of 5 to 7 volts. The purpose of this is to initiate a process for acquiring information regarding the transmission resistance of the channel to the local load 505. That information may be used by the controller to subsequently adjust the operational output voltage supply 501 to provide the appropriate power to the local load device 505. Embodiments of that process are described, for example, in U.S. Pat. No. 9,596,362 entitled "Automated Determination of Power Transmission Resistance," issued on Mar. 14, 2017, assigned to the assignee of the present invention, and incorporated by reference in its entirety herein (the "'362 Patent").

When the process of ascertaining and utilizing data regarding the transmission resistance has been satisfactorily completed, the process depicted in FIG. 10 proceeds to a line error check at 1050. This process calls a subroutine, such as that depicted in FIG. 11 which utilizes information from the ground-fault, over-current and over-voltage detection systems as described with respect to the subroutine of FIG. 11 below. Thus 1050, via the subroutine shown in FIG. 11, performs a series of checks to see whether there is anything that indicates the detection of an undesirable event, i.e., a "fault," found by the ground-fault, over-current, or over-voltage detection systems which information has been supplied by those systems to the controller as show on FIG. 5. In the event of fault, an error flag is set at 1007 for the application to utilize as appropriate.

On the other hand if no error is detected, a decision is made at 1006 to double check (as done previously at 1003 and 1004) to ensure that the channel is still active. This is so, because the detection of a fault by the ground-fault, over-current or over-voltage detection systems may have resulted in the immediate opening of the relay contacts 516*a* and 516*b* and at least temporary deactivation of that channel. So another check is performed at 1006 to make sure that the channel is still active.

If the decision is made at 1008 that the channel is not active, the process loops back to process 1003. If the channel is active, the process proceeds on at 1008 to 1009.

In summary, to get to 1009, the application has had to determine that the channel is active and is without error or "fault." At 1009 the process inquires whether there actually is a local load attached to conductors 507 and 508. As an indication that such a load exists, 1009 looks for a minimum current on the channel. There are multiple methods of doing this, such as, employing a current measuring device that separately provides this information or, alternatively, using the indicia of current that can be provided via line 526 associated with the over-current detection system shown in FIG. 5 and described in connection with FIG. 7. Either method results in acquiring a value for the existing electrical current in the transmission loop for this channel. That value can be compared against a pre-set minimum threshold value at 1009 (FIG. 10). One useful threshold employed in the depicted example is 5 mA.

If the minimum current is not detected at 1009, the process again loops to 1050 to perform a line error check again and to continue on in this manner until all is clear to proceed beyond 1009.

Assuming a minimum current is detected at point 1009, the application knows that there is a load connected to the channel and that it is drawing current. The application proceeds to 1010. The adjustable output voltage controller is now advised to set the voltage at an appropriate level using existing information such as the nature and requirements of the load, the transmission resistance as previously determined, etc.

Thereafter block 1051 does another line error check as described previously with respect to 1050. This is a check to make sure that everything is acceptable on the channel based on the ground-fault, over-current and over-voltage detection systems. Again, if an error is indicated at 1012, a flag is set and the process loops back to 1003.

If there is no error at 1051, then the process continues to check at 1013 to determine if the channel is still active. The process is now in "run mode," i.e., the application continues to loop from 1051 to 1013 and back again. That loop continues while everything is running normally and no errors have occurred in the operation of the channel. In essence, the application checks continuously to look for faults detected by the ground-fault, over-current, or over-voltage systems. If the line error check finds a fault at 1012, then it tells the application that it found an error by setting a flag and the process loops back to 1003. Alternatively, the program may disable the channel under the existing circumstances. If there is no error then 1013 looks to see if the channel is still active.

Figure 11:
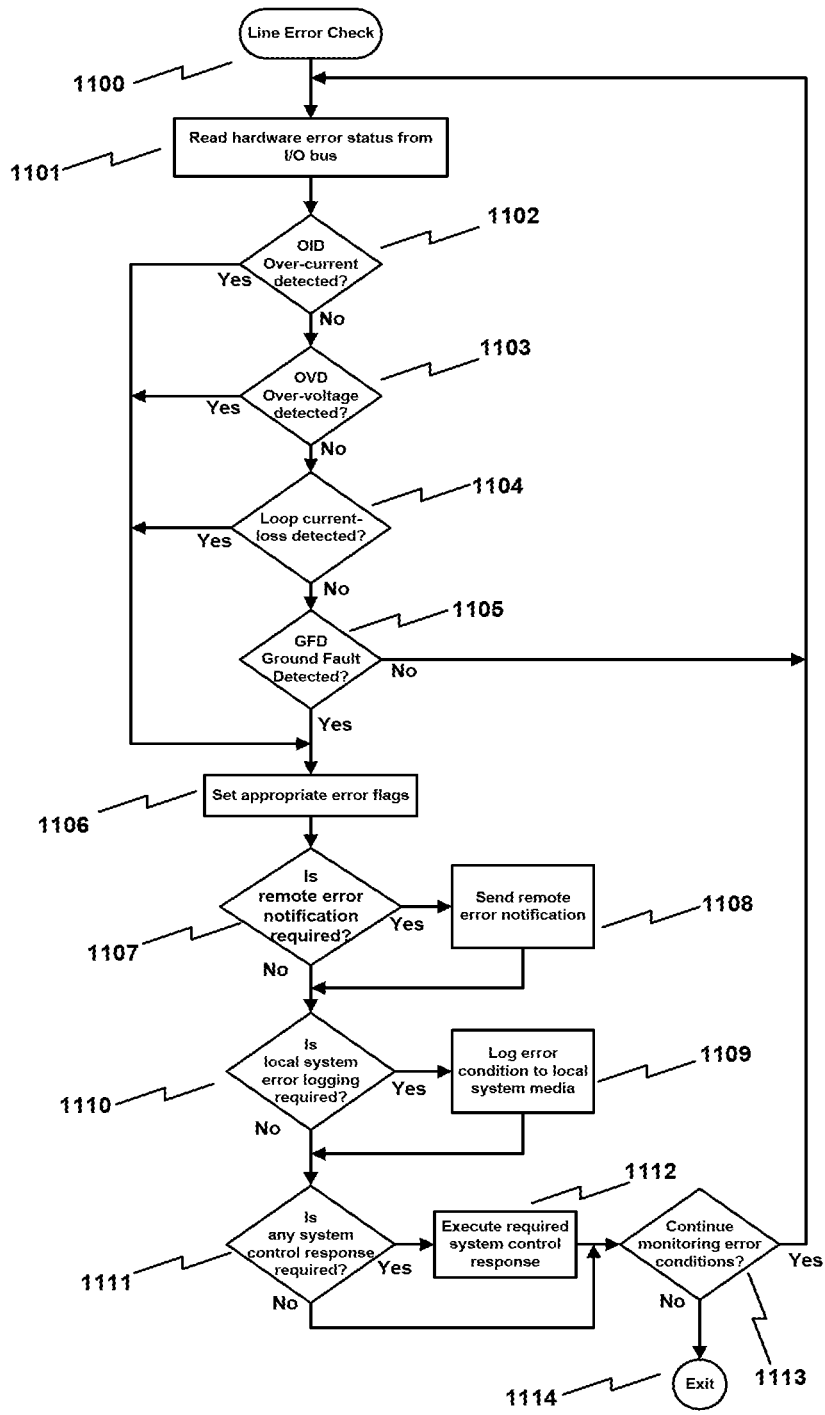
FIG. 11 is a high level flow chart depicting one embodiment of appropriate control logic for providing the line error check subroutine incorporated in the higher level operating system of FIG. 10.

FIG. 11 is a high level flow chart depicting one embodiment of appropriate control logic for providing the line error check subroutine used by the higher level operating system of FIG. 10. The logic of the flow chart may be executed on computer processor(s) of the main power supply controller, which is referenced as item 524 on FIG. 5. FIG. 11 is a high level flow chart depicting an appropriate error monitoring, response logging and reporting process. It is one embodiment of a "line error check" subroutine that can be "called" at 1050 and 1051 in the control process of FIG. 11.

The line error check routine begins when it is called at 1100. The subroutine then proceeds to 1101 where it "looks" to the status of hardware via an I/O bus. This means that it ascertains in a series of steps (1102, 1103 and 1105) whether an over-current, over-voltage or ground-fault problem has been detected, respectively. As noted previously, when any of these detection systems ascertains that there is a problem on the circuit, it automatically sends a signal to the load control that immediately opens the relay and disconnects power to the local load. (See, e.g. FIGS. 6, 7, 8 and 9.) As indicated in FIG. 5, each of these systems also sends a digital signal to the main power supply controller 524 to provide the information which is queried beginning at 1101.

If none of 1102, 1103 or 1105 finds an error signal in connection with any of the detection systems, the program loops back to 1001. But if any of 1102, 1103 or 1105 finds a presently existing error in connection with the detection systems, it sends a signal to 1106 and an appropriate error flag is set indicative of the nature of the error detected. That is also identified in the main program, i.e., FIG. 10 at 1007 and 1011.

Thus, at 1106, it has been determined, that an error has occurred. The logic sequence thereafter, i.e., 1107, 1110 and 1111, determines whether the nature of the error requires the taking of further action. It should be noted that in most instances there is only one currently existing error from the ground-fault, over-current and over-voltage detection systems. However, in the rare instance where more than one error has occurred simultaneously, the source of each error will be associated with the error flag.

At 1107, the subroutine looks at the flag and determines whether a remote error notification needs to be sent. If it does, that action occurs at 1108. For example, the program may send a notice over Ethernet to a server that is monitoring the DC circuit.

After 1107, the program proceeds to 1110 where the subroutine again looks at the flag and determines whether local system error logging is required. If so, that action occurs at 1109. For example, 1109 could advise a monitoring processor that looks at all channels. The processor would receive the error and log it in to a database or other file.

Finally, at 1111 the subroutine again looks at the flag and determines whether any system control response is required. If the answer is affirmative, the appropriate control response is effected at 1112. Examples of appropriate responses, depending on the flag, may include disabling of the channel, setting it as non-active, or taking other actions within the process control loop.

Following 1107, 1110 and 1111, the subroutine proceeds to 1113, where a query is made as to whether error conditions should continue to be monitored. If the answer is "yes," the subroutine loops back to 1101. If the answer is "no," the program proceeds to an "exit" at 1114. The parameters used to determine at 1113 whether monitoring should continue may be highly variable depending on the objectives of system management.

Example 2

FIG. 12 is a circuit diagram illustrating another embodiment of the ground-fault protection system as implemented, in this case, on a "floating," i.e., isolated power supply," rather than the "symmetric bi-polar" DC power supply illustrated in FIGS. 1-9.

In the example depicted in FIG. 12, DC power supply 1201 is not connected directly to a ground reference either via the more positive or the more negative terminal. As such, it is termed an "isolated" or "floating" power supply.

The power transmission "loop" in FIG. 12 is similar to that previously depicted in FIGS. 1-9 utilizing a "symmetric bi-polar" DC power supply. From the positive terminal of power source 1201 the transmission loop comprises line 1207 including relay gate 1216a through the load 1205 and then back through relay gate 1216b and line 1208 to the negative side of the power source 1201. Again, the goal of the ground-fault detection system is to determine whether the circuit has an external, inadvertent path, i.e., leakage to ground, as might occur as indicated by 12999a or 12999b on either side of the load. These constitute an inadvertent path that this circuit can detect.

Again, the ground-fault detection system utilizes a common mode union between the positive and negative terminals of the power source. This is accomplished via line 1209 from the positive terminal along with resistor 12129 and line 1210 from the negative terminal along with resistor 12130. These resistors are connected at 12131 to resistor 12132 which provides a path to ground 12150.

The way the common mode union is accomplished or applied in the circuit depicted in FIG. 12 is similar to the ground-fault detection circuit depicted in FIG. 6. Resistors 12129 and 12132 are effectively providing the same function similar to resistors 639 and 640 in FIG. 6. Resistors 12130 and 12132 are effectively performing the function similar to resistors 643 and 644 in FIG. 6.

Although they are not necessarily a part of the "common mode union," capacitor 12133 performs a function similar to capacitor 635 in FIG. 6. And clamping diodes 12134 are similar in function to diodes 642 and 646 in FIG. 6. Likewise, comparators 12135a and 12135b are similar in function to comparators 647a and 647b in FIG. 6. Because the effects of ground fault 12999a and 12999b are of opposite polarity due to their respective locations in the transmission circuit, a separate comparator may be required for each.

Because the power source 1201 is floating, the resistors 12129 and 12130 being of equal value—whatever that value may be for the particular instance, and in the absence of unintended fault paths such as 12999a or 12999b—the signal 12131 will effectively be at a ground or zero volt reference because of resistor 12132 going to earth ground 12150. In the event that an inadvertent path to ground 12999a or 12999b occurs on either side of the load 1205, it will diverts some of the current through the earth rather than through the intended power transmission loop. That would result in a difference in the signal 12131 relative to earth. So 12131 would no longer be at 0 volts.

The comparators 12135a and 12135b are configured in much the same way as comparators 647a and 647b in FIG. 6. Inputs 12136a and 12136b will be a reference voltage, and the desired leakage trip point will be defined by the combination of the selected reference voltage, the resistor divider 12129 and 12130, and the resistance value 12132. Again, the comparators are "open collectors." If either one of them detects a fault, then the output signal 12137 would go down to ground or its lower reference—whatever that is—and would turn off the voltage on signal 12137. At this point 12137 and 1221a are the same signal. Signal 1221a activates the load control 1215, which then opens contacts 1216a and 1216b as described in connection with FIG. 9. Companion fault signal 1221b is sent to the main power supply controller shown as 524 on FIG. 5.

Table F provides exemplary details for components of the embodiment of the ground-fault detection system depicted in FIG. 12 with source 1201 operating at 140V and "sized" to detect a 2 mA fault at either 12999a or 12999b.

TABLE F

| Item # | Description | Specs. | Part # & Source |
|---|---|---|---|
| 1201 | Power supply | See Table A, item 501. | See Table A, item 501. |
| 1205 | Local load | See Table A, item 505. | See Table A, item 505. |
| 1215 | Load control | See FIG. 9 and Table E. | See FIG. 9 and Table E. |
| 1216a | Relay on positive line from positive power source to local load | See Table E item 916a. | See Table E item 916a. |
| 1216b | Relay on negative line from negative power source to local load | See Table E item 916b. | See Table E item 916b. |
| 12129 | Resistor | 63.40 KΩ, 0.1%, 50 ppm, ⅓ W | RNCF1206BTC63K4 from Stackpole Electronics, Raleigh, NC |
| 12130 | Resistor | (same as 12129) | (same as 12129) |
| 12132 | Resistor | 301 Ω, 1%, 100 ppm, ⅛ W | ERJ-S06F3010V from Panasonic Corporation, Osaka, Japan |
| 12133 | Capacitor | 10 µF, 10%, 10 V, X7R | CL21B106KPQNFNE from Samsung Electro-Mechanics, Gyeonggi-do, South Korea |
| 12134 | Diodes | Diode, Dual, Series, 200 mA, 100 V | MMBD4148SE (two each) from ON Semiconductor, Phoenix, AZ |
| 12135a | Comparator | Comparator, ±2 mV-os, ±8 pA-ib | LM393APWR from Texas instruments, Dallas, TX. |
| 12135b | Maximum threshold comparator | (same as 12135a) | (same as 12135a) |
| 12136a | Threshold input to comparator 12135a | +600 mV | Value (not a component) |
| 12136b | Threshold input to comparator 12135b | (same as 12136a) | (same as 12136a) |
| 12138 | Resistor | 10 KΩ, 1%, 100 ppm, ⅛ W | RMCF0805FT10K0 from Stackpole Electronics, Raleigh, NC |
| 12139 | Capacitor | 1 µF, 10%, 16 V, X7R | GRM21BR71C105KA01L from Murata Manufacturing, Nagaokakyo, Japan |
| 12154 | Voltage source value | +5 V | Value (not a component) |

As previously noted the ground-fault, over-current and over-voltage detection systems mentioned herein use a maximum reference threshold to determine when a condition has occurred on the line that indicates the occurrence of an undesirable event. Although example thresholds have been postulated herein, these are only examples. The individual threshold for each detection system may be varied depending on the circumstances, e.g., the voltage and current being employed, the architecture of the transmission system, the nature of the power source and the local load, the equipment being employed in the power transmission circuit, etc.

The preceding description discusses multiple embodiments of the invention. As will be understood by one having skill in the art, many of these embodiments are combinable with one another and should not necessarily be viewed as distinct alternatives to one another. Similar embodiments may also be made or performed without departing from the spirit and scope of the invention described herein. Accordingly, the invention is defined by the claims below.

We claim:

1. A ground fault detection system for detecting ground faults, the system comprising:
   a common mode union, wherein a first portion of the common mode union is connected to a positive source of a power supply and a second portion of the common mode union is connected to a negative source of the power supply, wherein:
   the positive source has a more positive terminal and a more negative terminal, and the negative source has a more negative terminal and a more positive terminal; and
   the first portion of the common mode union is attached to the more negative terminal of the positive source and the second portion of the common mode union is attached to the more positive terminal of the negative source;
   a power supply symmetry circuit connected to the common mode union, wherein the power supply symmetry circuit is configured to generate a symmetry signal indicative of the symmetry of voltages of the positive terminal of the power supply and the negative terminal of the power supply;
   an offset threshold comparator circuit configured to generate a ground-fault signal indicating a ground fault based on the symmetry signal indicative; and
   a local load control circuit configured to remove power to a load in response to the ground-fault signal.

2. The system of claim 1, wherein the power supply symmetry circuit is further configured to receive the symmetry signal from the power supply symmetry circuit and compare the symmetry signal to a threshold voltage value.

3. The system of claim 1, wherein the local load control circuit is connected to the offset threshold comparator circuit and configured to receive the ground-fault signal from the offset threshold comparator circuit.

4. The system of claim 1, wherein the ground fault detection system detects ground faults in a power transmission circuit powering a load.

5. The system of claim 4, wherein the load is a local communications device and the power transmission circuit includes plain old telephone system (POTS) communication lines.

6. The system of claim 4, wherein the power supply provides direct-current power to the power transmission circuit.

7. The system of claim 1, wherein the power supply symmetry circuit includes at least one voltage divider and the offset threshold comparator circuit includes at least one comparator.

8. A ground fault detection system for detecting ground faults in a power transmission circuit for powering a load with direct-current power, the system comprising:
a common mode union, wherein a first portion of the common mode union is connected to a positive source of a power supply and a second portion of the common mode union is connected to a negative source of the power supply, wherein:
the positive source has a more positive terminal and a more negative terminal, and the negative source has a more negative terminal and a more positive terminal; and
the first portion of the common mode union is attached to the more negative terminal of the positive source and the second portion of the common mode union is attached to the more positive terminal of the negative source;
a power supply symmetry circuit connected to the common mode union, wherein the power supply symmetry circuit is configured to generate a symmetry signal indicative of a symmetry of voltages in the power transmission circuit;
an offset threshold comparator circuit configured to receive the symmetry signal, wherein the offset threshold comparator circuit is further configured to compare the symmetry signal from the power supply symmetry circuit to a threshold voltage value and generate a ground-fault signal indicating a ground fault when the symmetry signal exceeds the threshold voltage value; and
a local load control circuit configured to receive the ground fault signal, wherein the local load control circuit is further configured to remove power from the load based on the received ground-fault signal.

9. The ground fault detection system of claim 8, wherein removing power from the load includes opening the power transmission circuit.

10. The ground fault detection system of claim 8, wherein the symmetry of voltages in the power transmission circuit is a symmetry of voltages around at least one of an earth ground or a virtual ground.

11. The ground fault detection system of claim 8, wherein the load is a local communications device and the power transmission circuit includes plain old telephone system (POTS) communication lines.

12. The ground fault detection system of claim 8, wherein the power supply symmetry circuit comprises:
a first resistor having a first end connected to the first portion of the common mode union;
a second resistor connected to a second end of the first resistor and one of an earth ground or a virtual ground, wherein the first resistor and the second resistor operate as a first voltage divider;
a third resistor having a first end connected to the second portion of the common mode union; and
a fourth resistor connected to a second end of the third resistor and one of an earth ground or a virtual ground, wherein the third resistor and the fourth resistor operate as a second voltage divider.

13. The ground fault detection system of claim 12, wherein the power supply symmetry circuit comprises:
a first buffer amplifier, wherein an input of the first buffer amplifier is connected to the second end of the first resistor; and
a second buffer amplifier, wherein an input of the second buffer amplifier is connected to the second end of the third resistor.

14. The ground fault detection system of claim 12, wherein the offset threshold comparator circuit comprises:

a first comparator, wherein a first input of the first comparator is connected to the first voltage divider and a second input of the first comparator is connected to a reference signal representative of the threshold voltage value; and
a second comparator, wherein a first input of the first comparator is connected to the second voltage divider and a second input of the second comparator is connected to a reference signal representative of the threshold voltage value.

15. The ground fault detection system of claim 8, wherein the local load control circuit comprises a relay.

16. The ground fault detection system of claim 8, further comprising an over-current detection circuit connected to the common mode union.

17. The ground fault detection system of claim 8, further comprising an over-voltage detection circuit connected to the power transmission circuit.

18. A ground fault detection system for detecting ground faults in a power transmission circuit powering a load, the system comprising:
a common mode union, wherein a first portion of the common mode union is connected to a positive source of a power supply and a second portion of the common mode union is connected to a negative source of the power supply, wherein:
the positive source has a more positive terminal and a more negative terminal, and the negative source has a more negative terminal and a more positive terminal; and
the first portion of the common mode union is attached to the more negative terminal of the positive source and the second portion of the common mode union is attached to the more positive terminal of the negative source;
a power supply symmetry circuit connected to the common mode union, wherein the power supply symmetry circuit is configured to detect symmetry of voltages in a power transmission circuit;
an offset threshold comparator circuit connected to the power supply symmetry circuit and configured to receive a signal from the power supply symmetry circuit, wherein the offset threshold comparator circuit is further configured to compare the signal from the power supply symmetry circuit to a threshold voltage value and generate a ground-fault signal indicating a ground fault when the signal from the power supply symmetry circuit exceeds the threshold voltage value;
an over-current detection circuit connected to the common mode union, the over-current detection circuit configured to detect an over-current event;
an over-voltage detection circuit connected to the power transmission circuit, the over-voltage detection circuit configured to detect an over-voltage event; and
a local load control circuit configured to receive a signal from the offset threshold comparator circuit, a signal from the over-current detection circuit, and a signal from the over-voltage detection circuit, wherein the local load control circuit is further configured to open the power transmission circuit based on the received signals.

* * * * *